United States Patent
Oh

(10) Patent No.: US 9,552,896 B2
(45) Date of Patent: Jan. 24, 2017

(54) MEMORY CONTROLLER AND METHOD OF READING DATA FROM NONVOLATILE MEMORY BY MEMORY CONTROLLER

(71) Applicant: Samsung Electronics Co., Ltd., Suwon-Si, Gyeonggi-Do (KR)

(72) Inventor: Shin-Ho Oh, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 141 days.

(21) Appl. No.: 14/619,429

(22) Filed: Feb. 11, 2015

(65) Prior Publication Data

US 2015/0227420 A1 Aug. 13, 2015

(30) Foreign Application Priority Data

Feb. 11, 2014 (KR) ........................ 10-2014-0015628

(51) Int. Cl.
| | | |
|---|---|---|
| *G11C 29/00* | (2006.01) | |
| *G11C 29/52* | (2006.01) | |
| *G06F 11/10* | (2006.01) | |
| *G11C 11/56* | (2006.01) | |
| *G11C 29/04* | (2006.01) | |

(52) U.S. Cl.
CPC ............ *G11C 29/52* (2013.01); *G06F 11/102* (2013.01); *G06F 11/1048* (2013.01); *G06F 11/1072* (2013.01); *G11C 11/5642* (2013.01); *G11C 2029/0411* (2013.01)

(58) Field of Classification Search
CPC ............ G11C 29/52; G11C 2029/0411; G06F 11/1072; G06F 11/102; G06F 11/1048
See application file for complete search history.

(56) References Cited

U.S. PATENT DOCUMENTS

| | | | |
|---|---|---|---|
| 7,509,558 B2 | 3/2009 | Muller et al. | |
| 8,149,618 B2 | 4/2012 | Kang | |
| 8,351,256 B2 | 1/2013 | Son et al. | |
| 8,443,267 B2 | 5/2013 | Zhong et al. | |
| 8,479,083 B2 | 7/2013 | Chae et al. | |
| 8,631,306 B2 | 1/2014 | Lee et al. | |
| 8,667,368 B2 * | 3/2014 | Gupta | G06F 11/1064 365/185.12 |
| 8,898,541 B2 * | 11/2014 | Okubo | G06F 11/1048 714/755 |
| 2010/0275096 A1 | 10/2010 | Zhong et al. | |
| 2011/0185259 A1 * | 7/2011 | Seo | G06F 11/1048 714/763 |
| 2011/0208897 A1 | 8/2011 | Lee et al. | |
| 2012/0084490 A1 | 4/2012 | Choi et al. | |
| 2012/0134207 A1 | 5/2012 | Yoon et al. | |

(Continued)

*Primary Examiner* — Shelly A Chase
(74) *Attorney, Agent, or Firm* — Harness, Dickey & Pierce, P.L.C.

(57) ABSTRACT

Provided are a nonvolatile memory and a data reading method of reading data from a nonvolatile memory by the memory controller. The data reading method includes reading data from memory cells of the nonvolatile memory, storing the read data in the internal memory, overwriting some of the read data stored in the internal memory with backup data, performing an error correction operation using the backup data stored in the internal memory, and overwriting the backup data stored in the internal memory with data corrected by the error correction operation.

20 Claims, 19 Drawing Sheets

(56) References Cited

U.S. PATENT DOCUMENTS

| | | |
|---|---|---|
| 2012/0297273 A1 | 11/2012 | Sakaue et al. |
| 2013/0139035 A1 | 5/2013 | Zhong et al. |
| 2013/0139036 A1 | 5/2013 | Lee |
| 2013/0198577 A1 | 8/2013 | Oh et al. |
| 2014/0245103 A1* | 8/2014 | Torii .................. G06F 11/1068 714/758 |

* cited by examiner

FIG. 8

| Operation | Data | | | | | |
|---|---|---|---|---|---|---|
| First Reading (Hard Decision) | Input | ╳ | | | | |
| | Result | D1 | F1 | F2 | F3 | F4 |
| First Error Correction Decoding (HD Base) | Input | D1 | F1 | F2 | F3 | F4 |
| | Result | D2 | F1 | F2 | F3 | F4 |
| Storing at Host Buffer Area | Input | D2 | F1 | F2 | F3 | F4 |
| | Result | BD | F1 | F2 | F3 | F4 |

FIG. 11

| Operation | | Data | | | | |
|---|---|---|---|---|---|---|
| Second Reading (Soft Decision) | Input | | | | | |
| | Result | D3 | F1 | F2 | F3 | F4 |
| Second Error Correction Decoding (SD Base) | Input | D3 | F1 | F2 | F3 | F4 |
| | | D2 | F1 | F2 | F3 | F4 |
| | Result | D4 | F1 | F2 | F3 | F4 |
| Storing at Host Buffer Area | Input | D3 | F1 | F2 | F3 | F4 |
| | Storing | BD | F1 | F2 | F3 | F4 |

FIG. 14

| Operation | Data | | | | | |
|---|---|---|---|---|---|---|
| Third Reading (Hard Decision) | Input | ╳ | | | | |
| | Result | D5 | F1 | F2 | F3 | F4 |
| Third Error Correction Decoding (SD Base) | Input | D3 | F1 | F2 | F3 | F4 |
| | | D2 | F1 | F2 | F3 | F4 |
| | Result | D6 | F1 | F2 | F3 | F4 |
| Storing at Host Buffer Area | Input | D6 | F1 | F2 | F3 | F4 |
| | Storing | BD | F1 | F2 | F3 | F4 |

MEMORY CONTROLLER AND METHOD OF READING DATA FROM NONVOLATILE MEMORY BY MEMORY CONTROLLER

CROSS-REFERENCE TO RELATED APPLICATIONS

This US non-provisional patent application claims priority under 35 USC §119 to Korean Patent Application No. 10-2014-0015628, filed on Feb. 11, 2014, the entirety of which is hereby incorporated by reference.

BACKGROUND

At least some example embodiments of the inventive concepts relate to semiconductor memories and, more particularly, to a memory controller and a method of reading data from a nonvolatile memory by the memory controller.

Semiconductor memory device are memory devices implemented using semiconductors such as silicon (Si), germanium (Ge), gallium arsenide (GaAs), and indium phosphide (InP). In general, semiconductor memory devices are classified into volatile memory devices and nonvolatile memory devices.

Volatile memory devices lose their stored data when their power supplies are interrupted. Volatile memory devices include a static RAM (SRAM), a dynamic RAM (DRAM), a synchronous DRAM (SDRAM), and the like. Nonvolatile memory devices retain their stored data even when their power supplies are interrupted. Nonvolatile memory devices include a read only memory (ROM), a programmable ROM (PROM), an electrically programmable ROM (EPROM), an electrically erasable and programmable ROM (EEPROM), a flash memory, a phase-change RAM (PRAM), a resistive RAM (RRAM), a ferroelectric RAM (FRAM), and the like.

A semiconductor memory is used together with a memory controller. The memory controller is a semiconductor circuit configured to control the overall operation such as a read operation and a write operation of the semiconductor memory. The memory controller uses a random access memory as a working memory to control the semiconductor memory.

For many devices, a size (i.e., capacity) of a working memory used by a memory controller is closely connected to the manufacturing cost of the working memory. The greater the size of the working memory, the more the manufacturing cost of the working memory. The smaller the size of the working memory, the less the manufacturing cost of the working memory. In addition, for many devices, the size of the working memory is closely connected to operating performance of the memory controller. The greater the size of the working memory, the higher the operating performance of the memory controller. The smaller the size of the working memory, the lower the operating performance of the memory controller.

SUMMARY

At least some example embodiments of the inventive concepts provide a nonvolatile memory and a method of reading data from a nonvolatile memory by the memory controller.

According to at least some example embodiments of the inventive concepts, a data reading method of reading data from a nonvolatile memory by a memory controller including an internal memory, includes reading first data from memory cells of the nonvolatile memory; storing the read first data in the internal memory; overwriting some of the read first data stored in the internal memory with backup data; performing a first error correction operation using the backup data stored in the internal memory; and overwriting the backup data stored in the internal memory with data corrected by the first error correction operation.

The data reading method may further include after overwriting the backup data with the corrected data, outputting the data stored in the internal memory to an external entity as data read from the nonvolatile memory.

The reading data from memory cells may include reading the data such that a size of the read first data is a size of a read unit of data read at one time by the nonvolatile memory.

The data reading method may further include overwriting the backup data with data containing an error.

The data reading method may further include reading second data from the memory cells using a soft decision, wherein the backup data is associated with the soft decision.

The data reading method may further include reading second data from the memory cells, wherein the error correction is performed based on the backup data and the second data.

The reading the second data may include reading the second data using read voltages that are different from read voltages used when the first data was read.

The first data read from the memory cells may include a plurality of fields, and the storing the read first data in the internal memory may include performing an error correction decoding operation on each field of the read data to generate second data; and storing the second data in the internal memory.

The overwriting some of the read first data with the backup data may include reading third data from the memory cells using a soft decision; performing a second error correction operation on an error-containing one of the fields of the second data using the third data to generate fourth data; and overwriting a corresponding one of fields of the third data into an error field among the fields of the second data stored in the internal memory with the backup data, wherein the error field is a field containing an error that is not corrected by the second error correction.

The performing a first error correction operation using the backup data may include reading fourth data from the memory cells; and performing a third error correction decoding on a field of the third data corresponding to the error field using the backup data.

The overwriting the backup data with the data corrected by the error correction may include overwriting the error field stored in the internal memory with an error-corrected field corrected by the third error correction decoding.

The error correction may be performed based on low-density parity check (LDPC) code.

According to at least some example embodiments of the inventive concepts, a data reading method of reading data from a nonvolatile memory by a memory controller including an internal memory includes reading first data from memory cells of the nonvolatile memory using a first reading operation; storing the read first data in the internal memory; reading first data from memory cells of the nonvolatile memory using a second reading operation; generating backup data based on the second reading operation; overwriting some of the read first data stored in the internal memory with backup data; and performing a first error correction operation using the backup data stored in the internal memory.

The data reading method may further include overwriting the backup data stored in the internal memory with data corrected by the first error correction operation.

The first reading operation may be a hard decision reading operation and the second reading operation may be a soft decision reading operation.

The internal memory may include a processing region and a host buffer region, and the method may further include allocating the processing region to a processing core to use for executing an algorithm; and allocating the host buffer region to store data to be output from the memory controller to an external host, the backup data being overwritten in the host buffer region and not stored in the processing region.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

FIG. 8 illustrates an example of data processed while the first section is executed;

FIG. 11 illustrates an example of data processed while the second section is executed;

FIG. 14 illustrates an example of data processed while the third section is executed;

DETAILED DESCRIPTION

Figure 1:
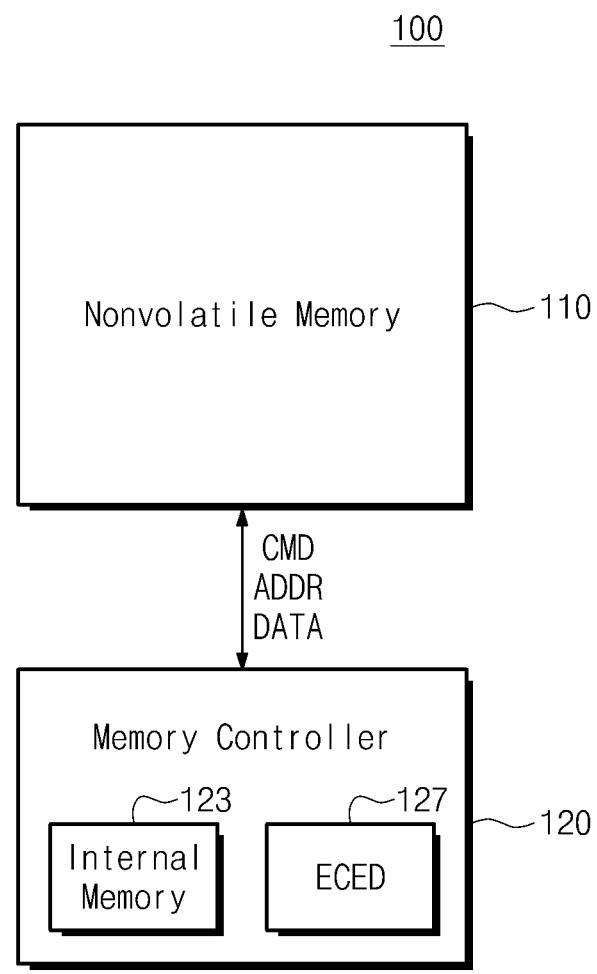
FIG. 1 is a block diagram of a memory system according to at least one example embodiment of the inventive concepts.

Detailed example embodiments of the inventive concepts are disclosed herein. However, specific structural and functional details disclosed herein are merely representative for purposes of describing example embodiments of the inventive concepts. Example embodiments of the inventive concepts may, however, be embodied in many alternate forms and should not be construed as limited to only the embodiments set forth herein.

Accordingly, while example embodiments of the inventive concepts are capable of various modifications and alternative forms, embodiments thereof are shown by way of example in the drawings and will herein be described in detail. It should be understood, however, that there is no intent to limit example embodiments of the inventive concepts to the particular forms disclosed, but to the contrary, example embodiments of the inventive concepts are to cover all modifications, equivalents, and alternatives falling within the scope of example embodiments of the inventive concepts. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concepts. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the inventive concepts. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/ acts involved.

FIG. 1 is a block diagram of a memory system 100 according to at least one example embodiment of the inventive concepts. As illustrated, the memory system 100 includes a nonvolatile memory 110 and a memory controller 120.

The nonvolatile memory 110 may receive a command CMD and an address ADDR from the memory controller 120. The nonvolatile memory 110 may exchange data DATA with the memory controller 120.

The command CMD may be a signal to indicate that a predetermined or, alternatively, desired operation is to be performed. The nonvolatile memory 110 may perform various operations such as read, program, and erase operations in response to the command CMD. The address ADDR may be a signal to identify storage spaces of the nonvolatile memory 110. The nonvolatile memory 110 may perform an operation (e.g., a read operation, a program operation, an erase operation, etc.) designated by the command CMD on the storage space identified by the address ADDR.

The memory controller 120 is configured to control the nonvolatile memory 110. The memory controller 120 may transmit the command CMD and the address ADDR to the nonvolatile memory 110. The memory controller 120 may exchange data DATA with the nonvolatile memory 110.

The memory controller 120 may control the nonvolatile memory 110 to perform a read, program or erase operation by transmitting a read, program or erase command to the nonvolatile memory 110.

The memory controller 120 includes an internal memory 123 and an error correction encoder and decoder (ECED) 127.

The internal memory 123 may be a random access memory used as a working memory, a cache memory or a buffer memory. The internal memory 123 may include a random access memory such as a static RAM (SRAM), a dynamic RAM (DRAM), a synchronous DRAM (SDRAM), phase-change RAM (PRAM), a resistive RAM (RRAM), magnetoresistive RAM (MRAM), a ferroelectric RAM (FRAM).

The error correction encoder and decoder 127 may perform error correction encoding on data to be written into the nonvolatile memory 110. The memory controller 120 may write the data encoded by the error correction encoder and decoder 127 into the nonvolatile memory 110. The error correction encoder and decoder 127 may perform error correction decoding on data read from the nonvolatile memory 110. For example, the error correction encoder and decoder 127 may correct an error of data read from the nonvolatile memory 110. The memory controller 120 may output data decoded by the error correction encoder and decoder 127 as final read data, may rewrite the decoded data into the nonvolatile memory 110 or may internally use the decoded data.

In at least some example embodiments of the inventive concepts, the memory controller 120, the internal memory 123, and the error correction encoder and decoder 127 may be integrated into a single semiconductor chip (i.e., a memory controller chip). In at least some example embodiments of the inventive concepts, the nonvolatile memory 110 and the memory controller 120 may be mounted on a single package.

In at least some example embodiments of the inventive concepts, the memory controller 120 may further transmit control signals (not shown) to the nonvolatile memory 110. For example, the memory controller 120 transmit, to the nonvolatile memory 110, an address latch enable (ALE) signal, a command latch enable (CLE) signal, a read enable (RE) signal, a write enable (WE) signal, a chip enable (CE) signal, a data strobe (DQS) signal, a write protect (WP) signal, and the like.

The ALE signal may be a signal to notify that an address ADDR has been transmitted to the nonvolatile memory 110. The CLE signal may be a signal to notify that a command CMD has been transmitted to the nonvolatile memory 110. The memory controller 120 may transmit the RE signal to the nonvolatile memory 110 to control a read operation of the nonvolatile memory 110. The memory controller 120 may transmit the WE signal to the nonvolatile memory 110 to notify that the address ADDR or the command CMD is transmitted to the nonvolatile memory 110. The memory controller 120 may transmit the CE signal to the nonvolatile memory 110 to select one of memory chips of the nonvolatile memory 110. The memory controller 120 may transmit the DQS signal to the nonvolatile memory 110 to control data communication with the nonvolatile memory 110. The memory controller 120 may transmit the WP signal to the nonvolatile memory 110 to prevent unintentional writing to the nonvolatile memory 110.

In at least some example embodiments of the inventive concepts, the memory controller 120 may supply various voltages to the nonvolatile memory 110. The memory controller 120 may supply a power supply voltage VCC, a ground voltage VSS, a power supply voltage VCCQ for input/output, and a ground voltage VSSQ for input/output to the nonvolatile memory 110.

Hereinafter, for brevity of description of at least some example embodiments of the inventive concepts, it will be described that the nonvolatile memory 110 includes a NAND flash memory. However, at least some example embodiments of the inventive concepts are not limited to the NAND flash memory. At least some example embodiments of the inventive concepts may be applied to nonvolatile memories including, for example, an electrically programmable read only memory (EPROM), an electrically erasable and programmable ROM (EEPROM), PRAM, MRAM, RRAM, FRAM, and the like. Moreover, at least some example embodiments of the inventive concepts are not limited to the nonvolatile memory 110. At least some example embodiments of the inventive concepts may be applied to volatile memories including, for example, one or more of a DRAM, SRAM, SDRAM, and the like.

Figure 2:
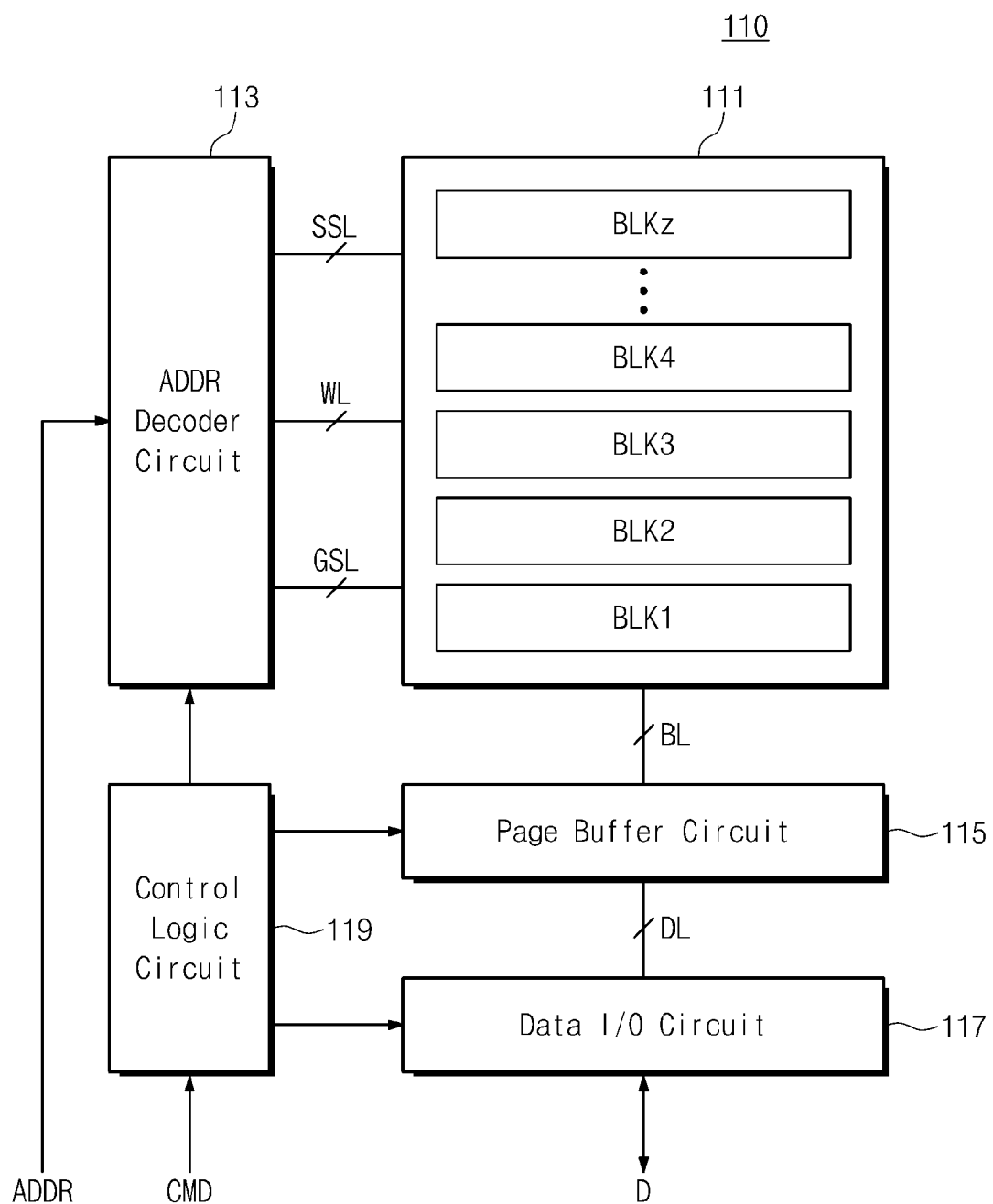
FIG. 2 is a block diagram of a nonvolatile memory according to at least one example embodiment of the inventive concepts.

FIG. 2 is a block diagram of a nonvolatile memory 110 according to at least one example embodiment of the inventive concepts. As illustrated, the nonvolatile memory 110 includes a memory cell array 111, an address decoder circuit 113, a page buffer circuit 115, a data input/output (I/O) circuit 117, and a control logic circuit 119.

The memory cell array 111 includes a plurality of memory blocks BLK1 to BLKz. Each of the memory blocks BLK1 to BLKz includes a plurality of memory cells. Each of the memory blocks may be connected to the address decoder circuit 113 through at least one ground selection line GSL, a plurality of wordlines WL, and at least one of string selection line SSL. Each of the memory blocks may be connected to the page buffer circuit 115 through a plurality of bitlines BL. The memory blocks BLK1 to BLKz may be commonly connected to the bitlines BL. Memory cells of the memory blocks BLK1 to BLKz may have the same structure.

The address decoder circuit 113 is connected to the memory cell array 11 through a plurality of ground selection lines GSL, a plurality of wordlines WL, and a plurality of string selection lines SSL. The address decoder circuit 113 operates according to the control of the control logic circuit 119. The address decoder circuit 113 may receive an address ADDR from the memory controller 120. The address decoder circuit 113 may decode the received address ADDR and control voltage applied to the wordlines WL according to the decoded address. For example, during a program operation, the address decoder circuit 113 may apply a pass voltage to the wordlines WL according to the control of the control logic 119. During the program operation, the address decoder circuit 113 may further apply a program voltage to a wordline indicated by an address ADDR among the wordlines WL.

The page buffer circuit 115 is connected to the memory cell array 111 through a plurality of bitlines BL. The page buffer circuit 115 is connected to the data I/O circuit 111 through a plurality of data lines DL. The page buffer circuit 115 operates according to the control of the control logic circuit 119.

The page buffer circuit 115 may store data to be programmed into memory cells of the memory cell array 111 or data read from the memory cells. During a program operation, the page buffer circuit 115 may store data to be programmed into memory cells. Based on the stored data, the page buffer circuit 115 may bias a plurality of bitlines BL. During the program operation, the page buffer circuit 115 may function as a write driver. During a read operation, the page buffer circuit 115 may sense voltages of the bitlines BL and store a sensing result. During the read operation, the page buffer circuit 115 may function as a sense amplifier.

The data I/O circuit 117 is connected to the page buffer circuit 115 through a plurality of data lines DL. The data I/O circuit 117 may exchange data DATA with the memory controller 120 (see FIG. 1).

The data I/O circuit 117 may temporarily store data DATA received from the memory controller 120. The data I/O circuit 117 may transmit the stored data to the page buffer circuit 115. The data I/O circuit 117 may temporarily store the data DATA transmitted from the page buffer circuit 115. The data I/O circuit 117 may transmit the stored data DATA to the memory controller 110. The data I/O circuit 117 may function as a buffer memory.

The control logic circuit 119 receives a command from the memory controller 120. The control logic circuit 119 may decode the received command CMD and control the overall operation of the nonvolatile memory 110 according to the decoded command. The control logic circuit 119 may further receive various control signals and voltages from the memory controller 120.

Figure 3:
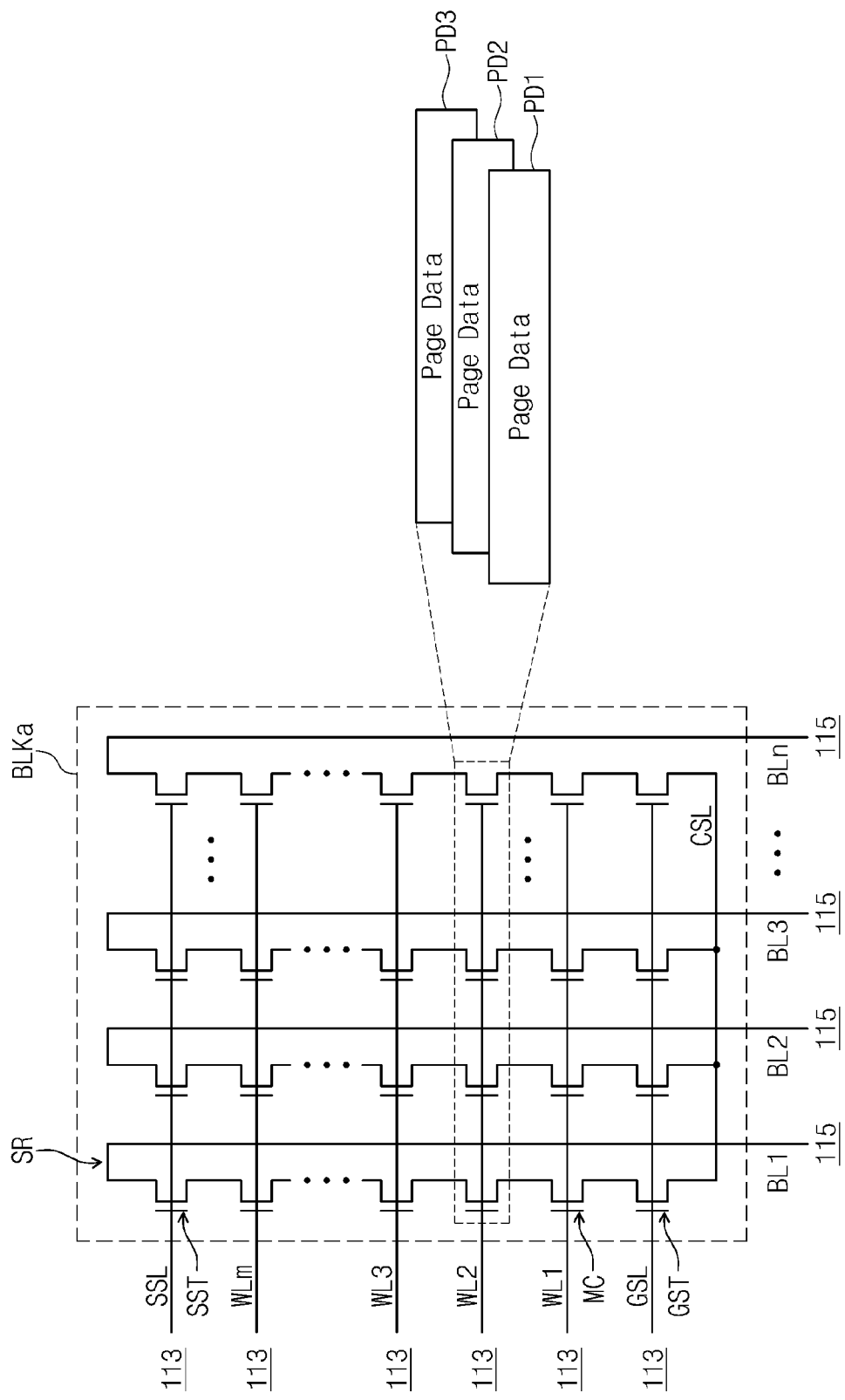
FIG. 3 is a circuit diagram of a memory block according to at least one example embodiment of the inventive concepts.

FIG. 3 is a circuit diagram of a memory block BLKa according to at least one example embodiment of the inventive concepts. Among the memory blocks BLK1 to BLKz of the memory cell array 111 in FIG. 2, one memory block BLKa is shown in FIG. 3 as an example.

Referring to FIGS. 2 and 3, the memory block BLKa includes a plurality of strings SR. The strings SR may be connected to a plurality of bitlines BL1 to BLn, respectively. Each of the strings SR includes a ground selection transistor GST, memory cells MC, and a string selection transistor SST.

The ground selection transistor GST of each string SR is coupled between memory cells MC and a common source line CSL. The ground selection transistors GST of the strings SR are commonly connected to the common source line GSL.

A string selection transistor SST of each string SR is coupled between memory cells MC and a bitline BL. String selection transistors SST of the strings SR are connected to the bitlines BL1 to BLn, respectively. The bitlines BL1 to BLn may be connected to the page buffer circuit 115.

In each string SR, a plurality of memory cells MC are provided between a ground selection transistor GST and a string selection transistor SST. In each string SR, a plurality of memory cells MC may be connected in series.

In the strings SR, memory cells disposed in the same order from a common source line CSL may be commonly connected to a single wordline. Memory cells MC of the strings SR may be connected to a plurality of wordlines WL1 to WLm. The wordlines WL1 to WLm may be connected to the address decoder circuit 113.

The memory cells MC connected to the single wordline WL may store one or more page data PD. Page data PD programmed into the memory cells MC connected to the single wordline WL may correspond to bitlines programmed into a single memory cell MC, respectively.

A first bit programmed into a single memory cell MC may correspond to first page data PD1. The first page data PD1 may be programmed with first bits into the memory cells MC connected to the single wordline WL. A second bit programmed into a single memory cell MC may correspond to second page data PD2. The second page data PD2 may be programmed with second bits into the memory cells MC connected to the single wordline WL. A third bit programmed into a single memory cell MC may correspond to third page data PD3. The third page data PD3 may be programmed with third bits into the memory cells MC connected to the single wordline WL. A $k^{th}$ bit programmed into a single memory cell MC may correspond to kth page data PDk. The kth page data PDk may be programmed with k bits into the memory cells connected to the single wordline WL.

For brevity of description, an example will be explained in which three page data is programmed into memory cells MC connected to a single wordline. However, at least some example embodiments of the inventive concepts are not limited thereto. At least some example embodiments of the inventive concepts may be applied to an example where k page data (k being an integer equal to or greater than 1) are programmed into memory cells MC connected to a single wordline.

Figure 4:
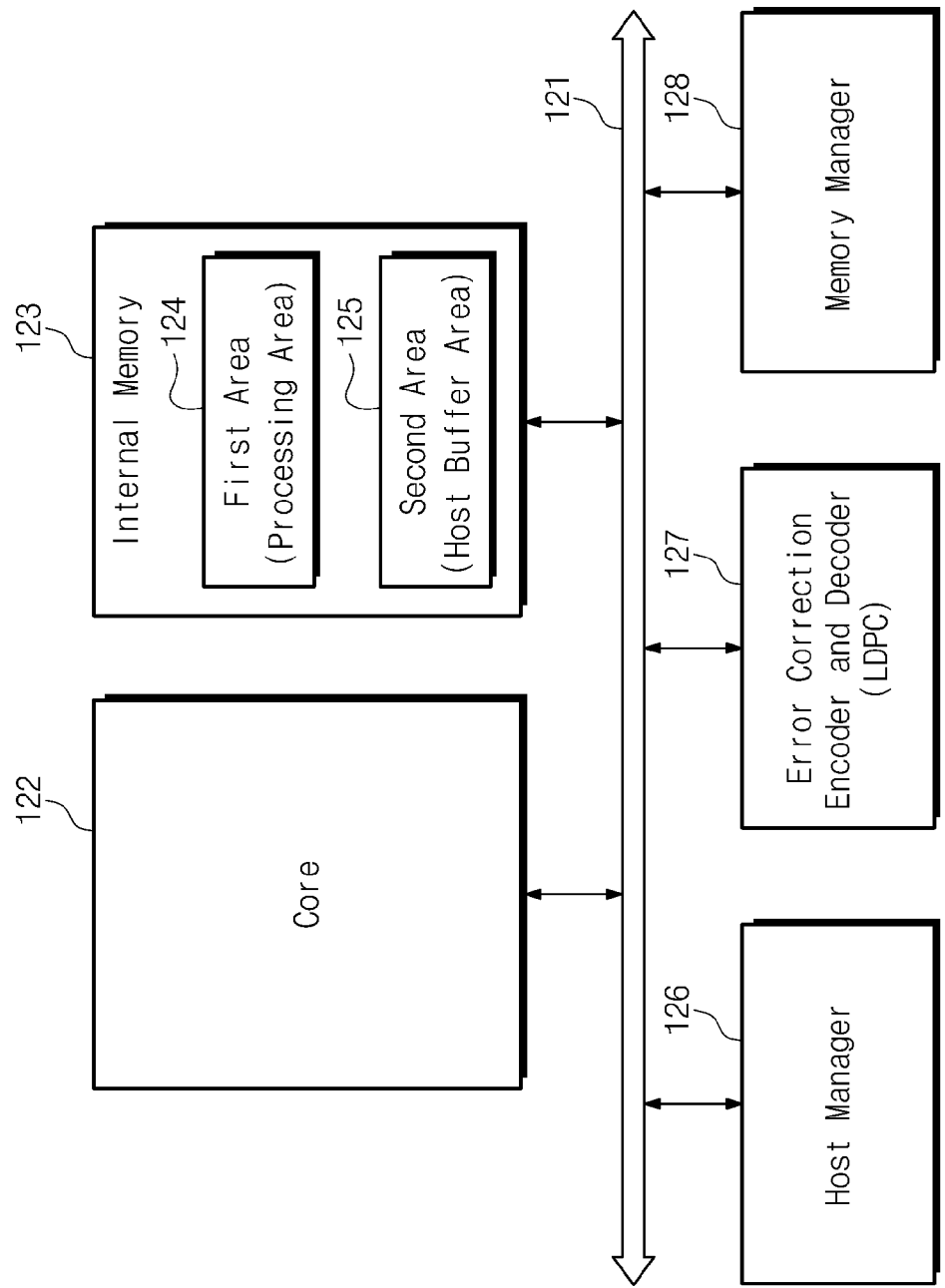
FIG. 4 is a block diagram of a memory controller according to at least one example embodiment of the inventive concepts.

FIG. 4 is a block diagram of a memory controller 120 according to at least one example embodiment of the inventive concepts. As illustrated, the memory controller 120 is a circuit that includes a bus 121, a core 122, an internal memory 123, a host manager 126, an error correction encoder and decoder 127, and a memory manager 128.

The bus 121 is configured to provide a channel between internal components of the memory controller 120. For example, the bus 121 may operate based on one of various bus protocols including, for example, one or more of advanced microcontroller bus architecture (AMBA), advanced high performance bus (AHB), advanced system bus (ASB), advanced peripheral bus (APB), peripheral component interconnect (PCI), and PCI-express.

The core 122 may be a circuit that controls components of the memory controller 120 and control the overall operation of the memory controller 120. The core 122 may perform execution of a command, processing of data, control of a device, and the like.

The internal memory 123 may be used as a working memory, a cache memory, a buffer memory or the like of the core 122. The internal memory 123 may include a random access memory including, for example, one or more of SRAM, DRAM, SDRAM, PRAM, MRAM, RRAM, and FRAM. The internal memory 123 includes a first region 124 and a second region 125.

The first region 124 may be a processing region. For example, the first region 124 may be a region allocated to be used when another the core 122 or another component (e.g., error correction encoder and decoder 127) of the memory controller 120 executes an algorithm.

The second region 125 may be a host buffer region. For example, the second region 125 may be a region allocated to store data to be output to an external host by the memory controller 120.

The host manager 126 operates according to control of the core 122. The host manager 126 may process a command received from an external host and transmit the processed command to the core 122 or the memory manager 128. The host manager 126 may store data received from the external host in the internal memory 123 (e.g., the second region 125). The host manager 126 may output data stored in the second region 125 to the external host.

The error correction encoder and decoder 127 operates according to control of the core 122. The error correction encoder and decoder 127 is configured to encode write data. For example, the error correction encoder and decoder 127 may encode data that is received from an external host and stored in the internal memory 123 or data to be written into the nonvolatile memory 110. The error correction encoder and decoder 127 is configured to decode read data. For example, the error correction encoder and decoder 127 may decode data that is read from the nonvolatile memory 110 and stored in the internal memory 123 or data to be output to the external host. The error correction encoder and decoder 127 may correct an error of data through error correction decoding.

In at least some example embodiments of the inventive concepts, the error correction encoder and decoder 127 may perform encoding and decoding based on low-density parity check (LDPC). For example, the error correction encoder and decoder 127 may map predetermined or, alternatively, desired likelihood values to data to be subjected to error correction. The error correction encoder and decoder 127 may map a likelihood value to a corresponding bit according to each bit value of data to be subjected to error correction. For example, when each bit has a value of '1', a first likelihood value may be mapped to a corresponding bit. When each bit as a value of '0', a second likelihood value may be mapped to a corresponding bit. An error may be corrected using mapping data in which likelihood values are mapped or a predetermined or, alternatively, desired parity check matrix.

The memory manager 128 operates according to the control of the core 122. The memory manager 128 is configured to control the nonvolatile memory 110. The memory manager 128 may transmit a read, write or erase command to the nonvolatile memory 110 according to an instruction from the core 122 or the host manager 126. The memory manager 128 may transmit data to the nonvolatile memory 110 or receive data from the nonvolatile memory 110. The memory manager 128 may transmit an address to the nonvolatile memory 110. The memory manager 128 may supply various control signals and voltages to the nonvolatile memory 110.

Figure 5:
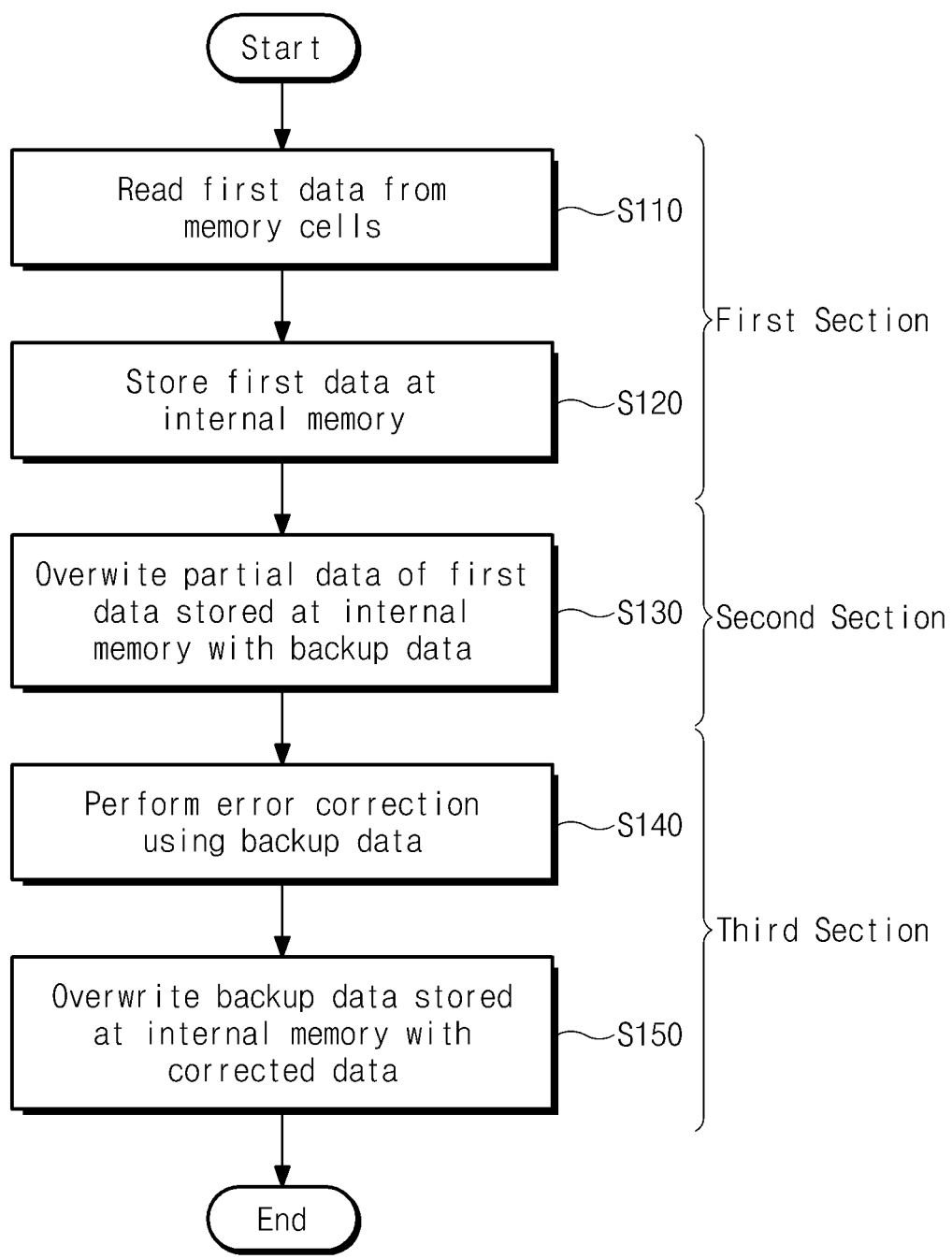
FIG. 5 is a flowchart summarizing a data reading method according to at least one example embodiment of the inventive concepts.

FIG. 5 is a flowchart summarizing a data reading method according to at least one example embodiment of the inventive concepts. Referring to FIGS. 1 to 5, first data is read from memory cells MC (S110). For example, the first data may be read from memory cells MC connected to a single wordline (e.g., WL2). For example, the first data may correspond to a read unit where data is read in the nonvolatile memory 110 at one time. The first data may correspond to one of three page data PD1 to PD3 stored in the memory cells MC connected to the wordline WL2.

The first data is stored in the internal memory 123 (S120). In at least some example embodiments of the inventive concepts, the first data may be stored in the second region (host buffer region) 125 of the internal memory 123.

The steps S110 and S120 may constitute a first section of data reading. The first section will be described in further detail later with reference to FIGS. 6 to 8.

Some of the first data stored in the internal memory 123 may be overwritten with backup data (S130). The backup data may be data required to process the first data read from the nonvolatile memory 110. The backup data may be data required to let the core 122 or the error correction encoder and decoder 127 execute a specific algorithm. The step S130 may constitute a second section of the data reading. The second section will be described in further detail later with reference to FIGS. 9 to 11. The backup data may be data required to let the error correction encoder and decoder 127 perform error correction, i.e., error correction based on low-density parity check.

Some data may include error-containing data among the first data. For example, the backup data may overwrite some error-containing data among the first data.

Error correction is performed, for example by the error correction encoder and decoder 127, using the backup data (S140). The error correction encoder and decoder 127 may perform error correction associated with the first data read from the nonvolatile memory 110 using the backup data stored in the internal memory 123. The error correction encoder and decoder 127 may perform error correction using the backup data to decode the first data read from the nonvolatile memory 110 into error-free final data.

The backup data stored in the internal memory 123 may be overwritten with corrected data (S150). For example, data corresponding to some data overwritten with the backup data and containing no error through error correction may overwrite the backup data.

The steps S140 and S150 constitute a third section of the data reading. The third section will be described in further detail later with reference to FIGS. 12 to 14.

As set forth above, the second region (host buffer region) 125 of the internal memory 123 is allocated to store the first data read from the nonvolatile memory 110. Conventionally, processed data for performing error correction is allocated to be stored in the first region (processing region) 124 of the internal memory 123. According to at least some example embodiments of the inventive concepts, backup data (i.e., processed data) is overwritten into an invalid part of the first data stored in the second region (host buffer region) 125. Specifically, the backup data is overwritten into an error-containing part of the first data stored in the second region (host buffer region) 125. Thus, the backup data (i.e., processed data) is stored not in the first region (processing region) 124 but in the second region (host buffer region) 125 while having no influence on a data read operation to read data from the nonvolatile memory 110.

Accordingly, even when capacity of the first region (processing region) 124 of the internal memory 123 is not sufficient for storing the backup data, a space to store backup data is secured in the second region (host buffer region) 125. Thus, operating performance of the memory system 100 may be improved. In addition, since the space to store the backup data is not needed in the first region (processing region) 124, capacity of the first region may be reduced and manufacturing cost of the memory system 100 may be reduced. In particular, if at least some example embodiments of the inventive concepts are applied to devices including a limited internal memory such as embedded multimedia card (eMMC) and universal flash storage (UFS), operating performance of the devices may be significantly improved.

Figure 6:
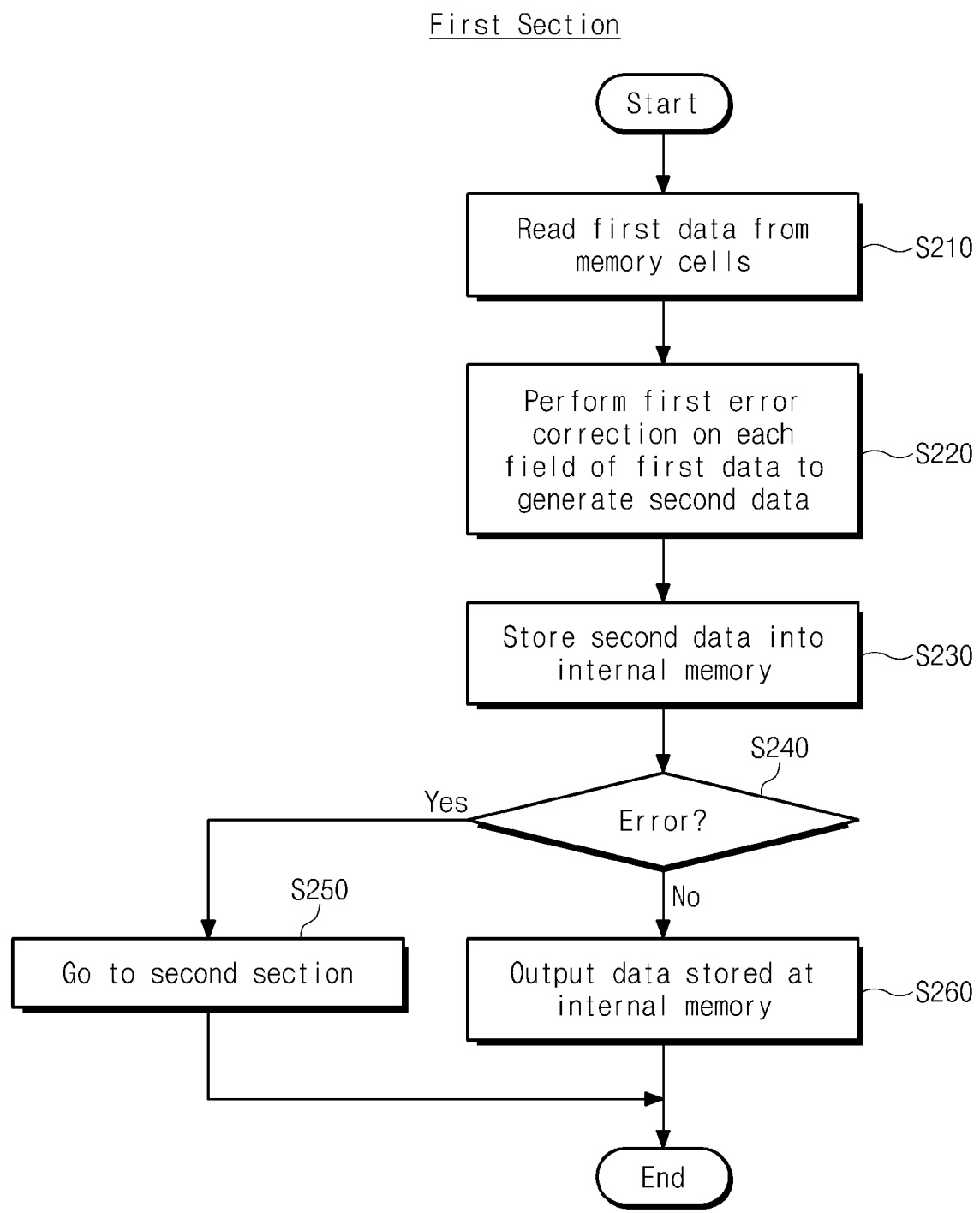
FIG. 6 is a flowchart summarizing a first section of data reading.
Figure 7:
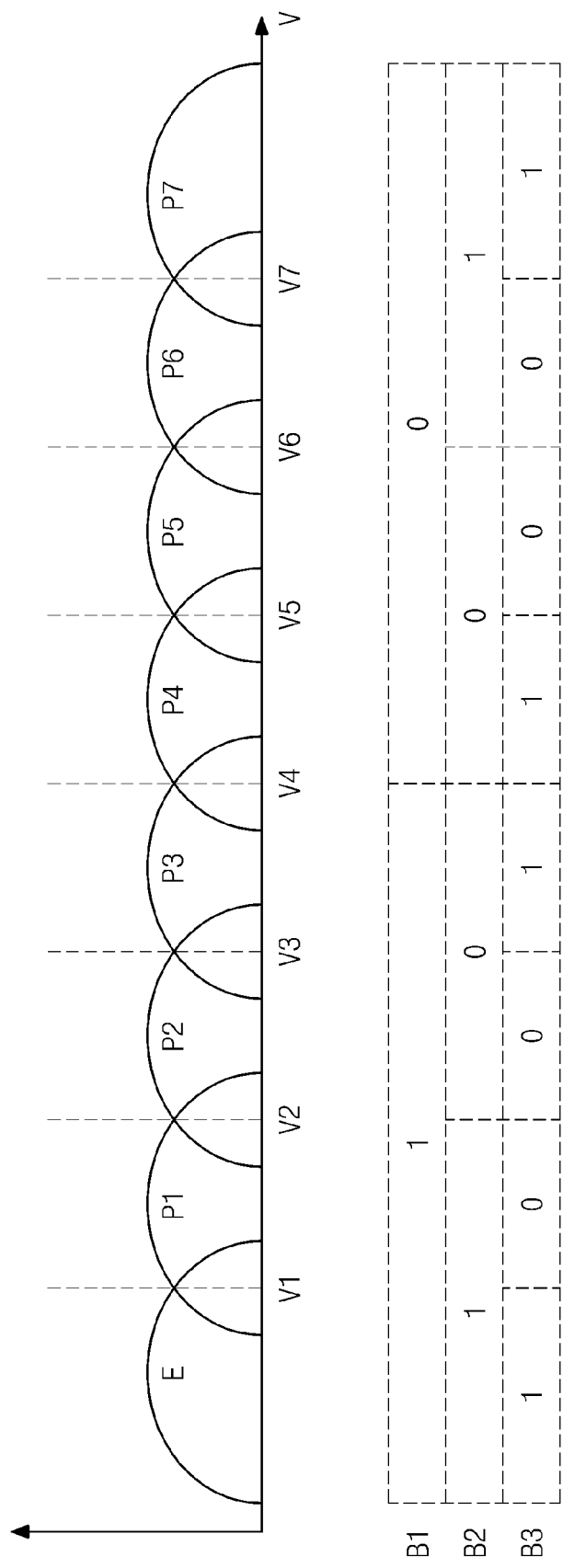
FIG. 7 illustrates distribution ranges of threshold voltages of memory cells and read voltages.

FIG. 6 is a flowchart summarizing the first section of data reading, and FIG. 7 illustrates distribution ranges of threshold voltages of memory cells and read voltages. In FIG. 7, a horizontal axis represents voltages (e.g., threshold voltages of memory cells MC) and a vertical axis represents the number of the memory cells MC. FIG. 8 illustrates an example of data processed while the first section is executed.

Referring to FIGS. 1 to 4 and FIGS. 6 to 8, first data is read from memory cells (S210). For example, first data D1 may be read from memory cells MC connected to a single wordline (e.g., WL2). The first data D1 may correspond to single page data among three page data PD1 to PD3 stored in the memory cells MC connected to the wordline WL2. The first data D1 may be read using a hard decision.

The three page data PD1 to PD3 are written into the memory cells MC connected to the wordline WL2. Each memory cell MC may store three bits. The bits stored in each memory cell MC may be a first bit B1, a second bit B2, and a third bit B3. First bits of memory cells MC1 may form the first page data PD1, second bits B2 of the memory cells MC1 may form second page data PD2, and third bits B3 of the memory cells MC1 may form third page data PD3.

The memory cells MC may have different distribution ranges of a threshold voltage depending on stored data. Data stored in the memory cells may be determined by determining levels of threshold voltages of the memory cells MC.

In at least some example embodiments of the inventive concepts, the memory cells MC may have threshold voltage distribution ranges corresponding to first to seventh program states P1 to P7. A memory cell MC having a threshold voltage corresponding to one range among an erase state E and the first to third program states P1 to P3 may have a first bit B1 having a value of '1'. A memory cell MC having a threshold voltage corresponding to one range among the fourth to seventh program states P4 to P7 may have a first bit B1 having a value of '0'.

A memory cell MC having a threshold voltage corresponding to one range among the erase state E, the second program state P2, the fourth program state P4, and the sixth program state P6 may have a third bit B3 having a value of '1'. A memory cell MC having a threshold voltage corresponding to one range among the first program state P1, the third program state P3, the fifth program state P5, and the sixth program state P6 may have a third bit B3 having a value of '0'.

The states E and P1 to P7 shown in FIG. 7 and values of the first to third bits B1 to B3 respectively mapped to the states E and P1 to P7 are examples, and at least some example embodiments of the inventive concepts are not limited thereto.

Data reading using the hard decision may be performed by applying a voltage between the states E and P1 to P7 to memory cells MC. In at least some example embodiments of the inventive concepts, when the first page data PD1, i.e., first bits B1 are read from the memory cells MC, a fourth voltage V4 may be used. The fourth voltage V4 may be applied to a wordline WL2, first bits B1 of the memory cells MC may be determined depending on whether memory cells MC connected to the wordline WL2 are turned on or turned off.

The turned-on memory cell MC has a lower threshold voltage than the fourth voltage V4 and is identified to have a threshold voltage corresponding to one range among the erase state E and the first to third program states P1 to P3. That is, a first bit B1 of the turned-on memory cell MC is identified to be '1'.

The turned-off memory cell MC has a higher threshold voltage than the fourth voltage V4 and is identified to have a threshold voltage corresponding to one range among the fourth to seventh program states P4 to P7. That is, a first bit B1 of the turned-off memory cell MC is identified to be '0'.

Similarly, when the second page data PD2, i.e., second bits B2 are read from the memory cells MC, a second voltage V2 and a sixth voltage V6 may be used. A second bit B2 of a memory cell MC having a threshold voltage lower than the second voltage V2 or higher than the sixth voltage V6 may be identified to be '1'. A second bit B2 of a memory cell MC having a threshold voltage higher than the second voltage V2 and lower than the sixth voltage V6 may be identified to be '0'.

Similarly, when the third page data PD3, i.e., third bits B3 are read from the memory cells MC, a first voltage V1, a third voltage V3, a fifth voltage V5, and a seventh voltage V7 may be used. A third bit B2 of a memory cell MC having a threshold voltage lower than the first voltage V1, higher than the third voltage V3 and lower than the fifth voltage V5 or higher than the seventh voltage V7 may be identified to be '1'. A third bit B3 of a memory cell MC having a threshold voltage higher than the first voltage V1, lower than the third voltage V3 and higher than the fifth voltage V5 or lower than the seventh voltage V7 may be identified to be '0'.

When first reading using the hard decision is performed, first data D1 is generated. The first data D1 may be one of the first to third page data PD1 to PD3. The first data D1 may include a plurality of bits. Each bit of the first data D1 may correspond to each memory cell MC. The bits of the first data D1 may be divided into a plurality of fields F1 to F4.

Acco5ding to at least some example embodiments of the inventive concepts, a field may be a unit of data subjected to error correction in the error correction encoder and decoder 127. The error correction encoder and decoder 127 may perform error correction encoding or decoding on each field. For brevity of description, let it be assumed that a single page which is a read unit of the nonvolatile memory 110 is divided into fourth fields. However, at least some example embodiments of the inventive concepts are not limited thereto.

A first error correction is performed on each field of the first data D1 to generate second data D2 (S220). For example, errors within a first range may be corrected in each field of the first data D1. The error correction encoder and decoder 127 may perform an error correction decoding on each field of the first data D1 read from the nonvolatile memory 110. The error correction encoder and decoder 127 may map a likelihood value to each bit to generated mapping data according to a value of each bit of partial data of a selected one of the fields F1 to F4 of the first data D1. For example, when each bit has a value of '1', a first likelihood value may be mapped to each bit. When each bit has a value of '0', a second likelihood value may be mapped to each bit. The error correction encoder and decoder 127 may perform the error correction decoding using mapping data and a predetermined or, alternatively, desired parity check matrix.

An error of a field having errors within the first range (e.g., error bit number within the first range) among the fields F1 to F4 of the first data may be corrected by the first error correction. An error of a field having errors out of the first range among the fields F1 to F4 of the first data D1 may not be corrected. When the first error correction is performed, second data D2 may be generated.

In a field where there is no error, values of bits of the first data D1 and the second data D2 may be equal to each other. In an error-corrected field, values of bits of the first data D1 and the second data D2 may be partly different from each other. For example, values of error-corrected bits of the first data D1 and the second data D2 may be different from each other. In an error-uncorrected field, values of bits of the first data D1 and the second data D2 may be equal to each other.

A first field of the second data D2 may not have an error. For example, the first field of the second data D2 may be an error-corrected field or a field where there is no error. Each of the second to fourth fields F2 to F4 of the second data may be an error field containing an error. For example, each of the second to fourth fields F2 to F4 of the second data D2 may have errors out of the first range. That is, each of the second to fourth fields F2 to F4 of the second data D2 may have errors that are not corrected by the first error correction.

The first data D1 where errors within the first range are corrected, i.e., the second data D2 is stored in the internal memory 230 (S230). The second data D2 may be stored in the second region (host buffer region) 125 of the internal memory 123 as buffer data BD.

Determination is made, for example by the error correction encoder and decoder 127, as to whether there is an error even after the first error correction is performed (S240). For example, the error correction encoder and decoder 127 may determine whether there is an error in the second data D2. For example, the error correction encoder and decoder 127 may determine whether there is an error in the buffer data BD stored in the second region (host buffer region) 125 of the internal memory 123.

When there is an error, a second section is executed (S250). When there is not error, the buffer data BD stored in the second region (host buffer region) of the internal memory 123 may be output (S260). For example, the buffer data BD may be output to an external host as error-corrected final read data. As another example, the buffer data BD may be rewritten into the nonvolatile memory 110 or may be internally used in the memory controller 120.

Figure 9:
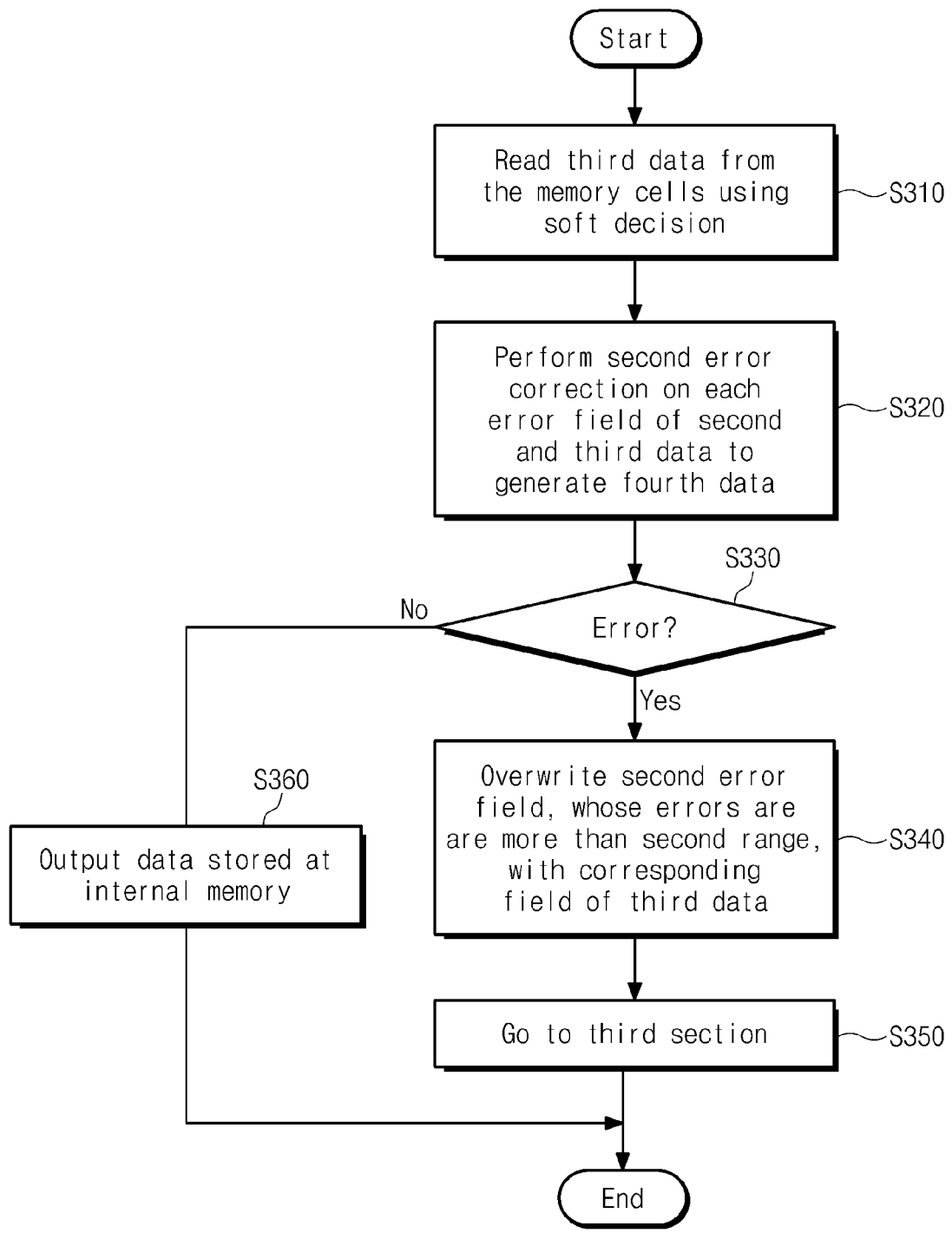
FIG. 9 is a flowchart summarizing a second section of data reading.
Figure 10:
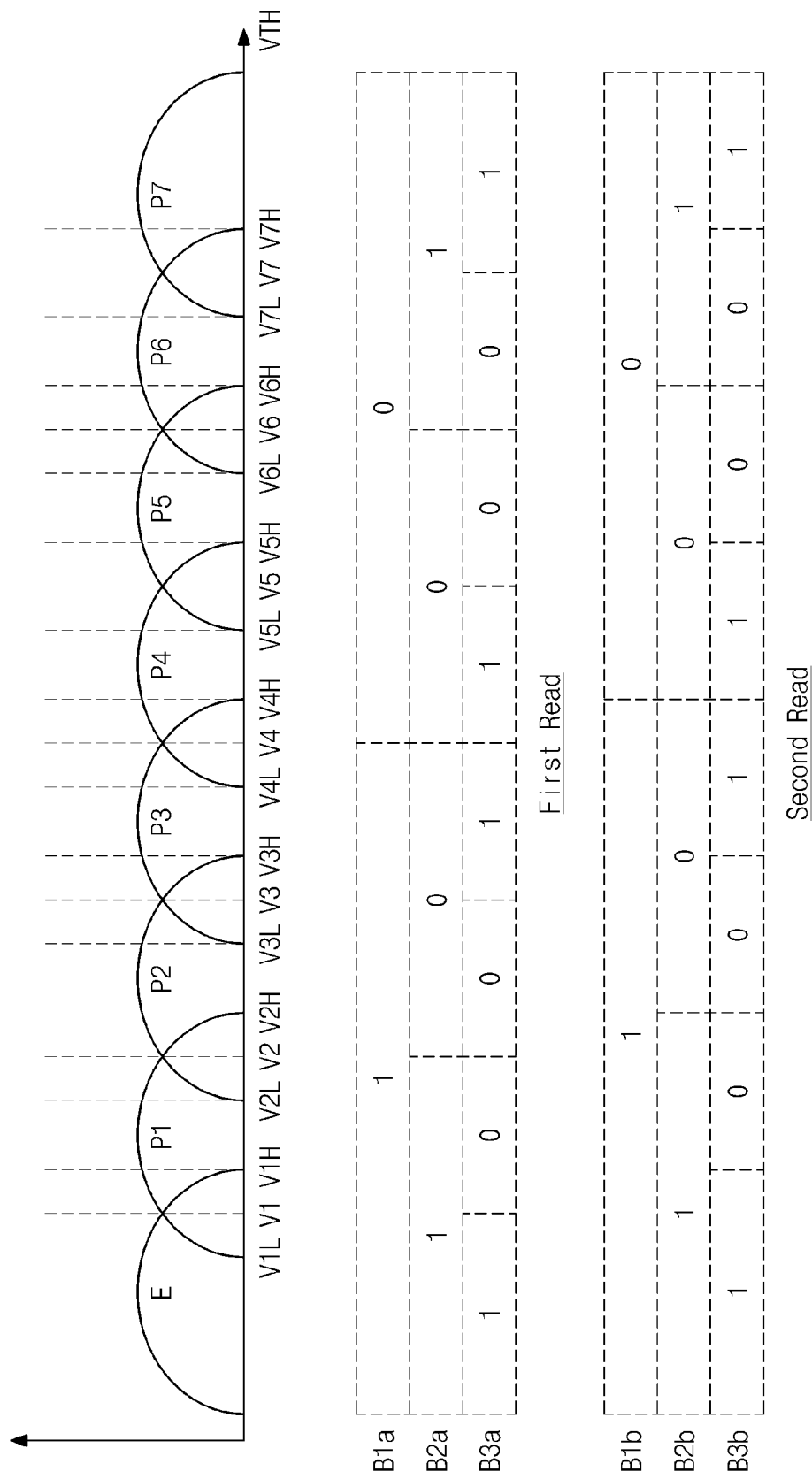
FIG. 10 illustrates another example of distribution ranges of threshold voltages of memory cells and read voltages.

FIG. 9 is a flowchart summarizing a second section of data reading, and FIG. 10 illustrates another example of distribution ranges of threshold voltages of memory cells MC and read voltages. In FIG. 10, a horizontal axis represents voltages (or threshold voltages of memory cells) and a vertical axis represents the number of the memory cells. FIG. 11 illustrates an example of data processed while the second section is executed Referring to FIGS. 1 to 4 and FIGS. 9 to 11, third data D3 is read from memory cells (S310). The third data D3 may correspond to single page data among three page data PD1 to PD3 stored in memory cells MC connected to a wordline WL2. The third data D3 may correspond to the same page data as the first data D1. The third data D3 may be read using a soft decision.

Data reading using a soft decision may include at least two readings. For brevity of description of at least some example embodiments of the inventive concepts, an example will be explained in which reading using soft decision includes two readings. However, according to at least some example embodiments of the inventive concepts, the reading using the soft decision may include at least three readings, or more.

Each of two readings using the soft decision may be performed by applying a voltage between the states E and P1 to P7 to the memory cells. Voltage applied during each reading using soft decision may be different from voltages V1 to V7 during reading using the hard decision explained with reference to FIGS. 6 to 8.

In at least some example embodiments of the inventive concepts, first to seventh voltages V1L to V7L may be used during first reading using soft decision. The first to seventh voltages V1L to V7L may have similar but lower levels than the first to seventh voltages V1 to V7 during the soft decision.

During the first reading using the soft decision, a fourth voltage V4L may be used when first page data PD1, i.e., first bits B1$a$ are read. A first bit B1$a$ of a memory cell MC having a threshold voltage lower than the fourth voltage V4L may be decided to be '1'. A first bit B1$a$ of a memory cell MC having a threshold voltage higher than the fourth voltage V4L may be decided to be '0'.

During the first reading using the soft decision, a second voltage V2L and a sixth voltage V6L may be used when second page data PD2, i.e., second bits B2$a$ are read. A second bit B2$a$ of a memory cell MC having a threshold voltage lower than the second voltage V2L or higher than the sixth voltage V6L may be decided to be '1'. A second bit B2$a$ of a memory cell MC having a threshold voltage between the second voltage V2L and the sixth voltage V6L may be decided to be '0'.

During the first reading using the soft decision, a first voltage V1L, a third voltage V3L, a fifth voltage V5L, and a seventh voltage V7L may be used when third page data PD3, i.e., third bits B3$a$ are read. A third bit B3$a$ of a memory cell MC having a threshold voltage lower than the first voltage V1L, between the third voltage V3L and the fifth voltage V5L or higher than the seventh voltage V7L may be decided to be '1'. A third bit B3$a$ of a memory cell MC having a threshold voltage between the first voltage V1L and the third voltage V3L or between the fifth voltage V5L and the seventh voltage V7L may be decided to be '0'.

In at least some example embodiments of the inventive concepts, first to seventh voltages V1H to V7H may be used during second reading using the soft decision. The first to seventh voltages V1H to V7H may have similar but higher levels than the first to seventh voltages V1 to V7 during hard decision.

During the second reading using the soft decision, a fourth voltage V4H may be used when first page data PD1, i.e., first bits B1$b$ are read. A first bit B1$b$ of a memory cell MC having a threshold voltage lower than the fourth voltage V4H may be decided to be '1'. A first bit B1$b$ of a memory cell MC having a threshold voltage higher than the fourth voltage V4H may be decided to be '0'.

During the second reading using the soft decision, a second voltage V2H and a sixth voltage V6H may be used when second page data PD2, i.e., second bits B2$b$ are read. A second bit B2$b$ of a memory cell MC having a threshold voltage lower than the second voltage V2H or higher than the sixth voltage V6H may be decided to be '1'. A second bit B2$b$ of a memory cell MC having a threshold voltage between the second voltage V2H and the sixth voltage V6H may be decided to be '0'.

During the second reading using the soft decision, a first voltage V1H, a third voltage V3H, a fifth voltage V5H, and a seventh voltage V7H may be used when third page data PD3, i.e., third bits B3$b$ are read. A third bit B3$b$ of a memory cell MC having a threshold voltage lower than the first voltage V1H, between the third voltage V3H and the fifth voltage V5H or higher than the seventh voltage V7H may be decided to be '1'. A third bit B3b of a memory cell MC having a threshold voltage between the first voltage V1H and the third voltage V3H or between the fifth voltage V5H and the seventh voltage V7H may be decided to be '0'.

Data read during the first reading using the soft decision and data read during the second reading using the soft decision may be combined to generate third data D3 using the soft decision. For example, an operation (e.g., exclusive-OR (XOR) operation) may be performed on data decided during the first reading and the second reading to generate third data D3. That is, the third data D3 may indicate whether results of the first reading and the second reading relative to each memory cell MC are identical to each other or different from each other. A size of the third data D3 may be equal to that of the first data D1. A plurality of bits of the third data D3 may be divided into a plurality of fields F1 to F4.

A second error correction is performed on each error field having errors out of the first range of the second data D2 and the third data D3 to generate fourth data D4 (S320). For example, error correction may be performed on the second data D2 using the third data D3 to correct errors within the second range.

For example, each memory cell MC corresponds to a single bit of the second data D2 and a single bit of the third data D3. The error correction encoder and decoder 127 may map likelihood values to each error field of the second data D2 and the third data D3 to generate mapping data. A first likelihood value may be mapped to each bit when a value of each bit of an error field of the second data D2 is '1' and a corresponding bit of a corresponding field of the third data D3 has a first value (e.g., a value indicating that the results of the first reading and the second reading are identical to each other). A second likelihood value may be mapped to each bit when a value of each bit of an error field of the second data D2 is '0' and a corresponding bit of a corresponding field of the third data D3 has the first value. A third likelihood value may be mapped to each bit when a value of each bit of an error field of the second data D2 is '1' and a corresponding bit of a corresponding field of the third data D3 has a second value (e.g., a value indicating that results of the first reading and the second reading are different from each other). A fourth likelihood value may be mapped to each bit when a value of each bit of an error field of the second data D2 is '0' and a corresponding bit of a corresponding field of the third data D3 has the second value. The first likelihood value and the second likelihood value may be greater than the third likelihood value and the fourth likelihood value, respectively. A corresponding field may indicate a field of the same position, and a corresponding bit may indicate a bit of the same position.

The second error correction may be performed using mapping data to which likelihood values are mapped and a parity check matrix. The mapping data used in the second error correction uses a larger number of likelihood values than the mapping data used in the first error correction. Thus, accuracy of the second error correction may be higher than that of the first error correction and the second range may be wider than the first range.

If the second error correction decoding is performed, fourth data D4 is generated. Among fields F2 to F4 of the fourth data D4, an error-corrected field F2 may be overwritten into a corresponding field stored in the second region (host buffer region) of the internal memory 123.

Determination is made, for example by the error correction encoder and decoder 127, as to whether there is an error (S330). In at least some example embodiments of the inventive concepts, after the second error correction is performed, the error correction encoder and decoder 127 may determine whether there is an error-uncorrected field among the fields F2 to F4 of the fourth data D4 as it has an error outside of the second range.

When there is an error, a second error field having errors outside of the second range is overwritten into a corresponding field of the third data D3. For example, corresponding fields of the third data D3 (e.g., second and fourth fields F2 and F4) may be overwritten into second error fields having errors outside of the second range (e.g., second and fourth fields F2 and F4) among fields stored in the second region (host buffer region) 125 (S340). Thus, according to at least one example embodiment of the inventive concepts, the third data D3 including, for example, the XOR values generated based on the soft decision in step S310, are an example of the backup data that is overwritten to a portion of the first data stored in the internal memory as is discussed above with respect to step S130 in FIG. 5. Thereafter, a third section may be executed, for example, by the error correction encoder and decoder 127 (S350).

When there is no error, the buffer data BD stored in the second region (host buffer region) 125 is output. For example, the buffer data BD may be output to an external host as error-corrected final read data. As another example, the buffer data BD may be rewritten into the nonvolatile memory 110 or may be internally used in the memory controller 120.

Figure 12:
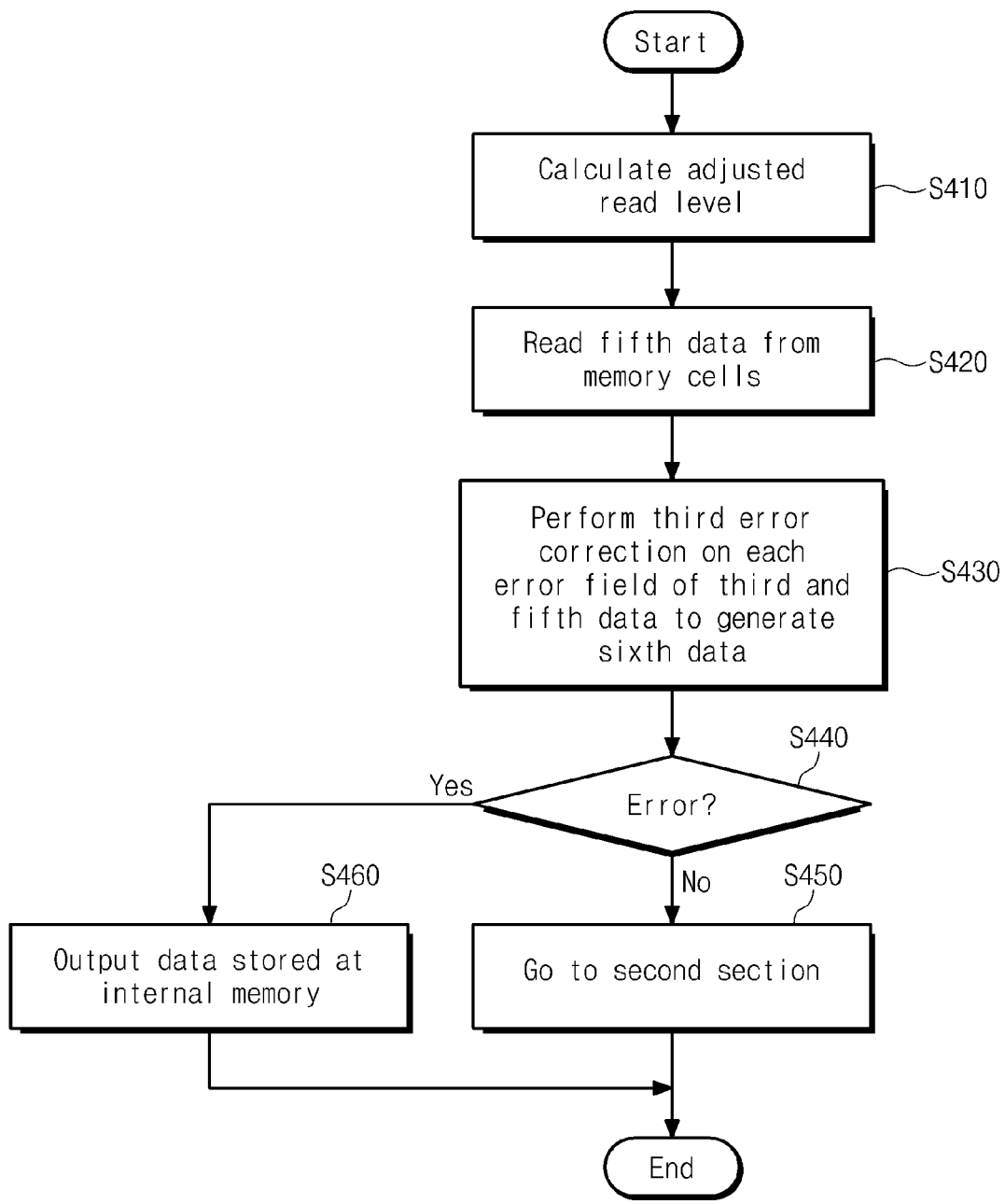
FIG. 12 is a flowchart summarizing a third section of data reading.
Figure 13:
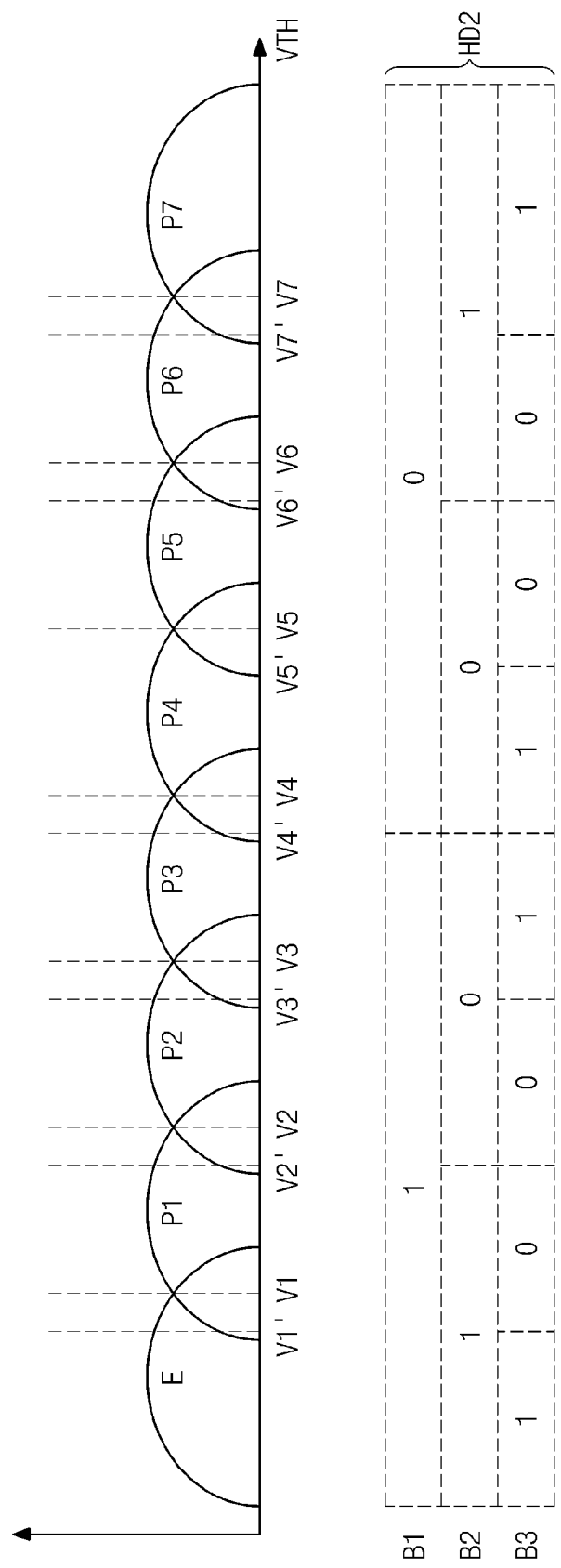
FIG. 13 illustrates another example of distribution ranges of threshold voltages of memory cells and read voltages.

FIG. 12 is a flowchart summarizing a third section of data reading, and FIG. 13 illustrates another example of distribution ranges of threshold voltages of memory cells and read voltages. In FIG. 13, a horizontal axis represents voltages (or threshold voltages of memory cells MC) and a vertical axis represents the number of memory cells. FIG. 14 illustrates an example of data processed while the third section is executed Referring to FIGS. 1 to 4 and FIGS. 12 to 14, a read level is adjusted (S410). For example, a level of a read voltage used to read data from memory cells MC may be adjusted. A level of a read voltage to be used during reading using the hard decision may be adjusted. A level of a read voltage may be adjusted depending on a result of error correction explained with reference to FIGS. 9 to 11.

Fifth data D5 is read from the memory cells MC using the adjusted read level (S420). For example, the fifth data D5 may be read from memory cells MC connected to a single wordline (e.g., WL2). The fifth data D5 may correspond to one of three page data PD1 to PD3 stored in the memory cells MC connected to the wordline WL2. The fifth data D5 may correspond to the same page data as the first data D 1. The fifth data D5 may read using the hard decision. The fifth data D5 are divided into a plurality of fields F1 to F4.

During reading using the hard decision, first to seventh voltages V1' to VT may be used. The first to seventh voltages V1' to VT may have levels adjusted from the first to seventh voltage V1 to V7 explained with reference to FIGS. 6 to 8. In at least some example embodiments of the inventive concepts, the first to seventh voltages V1' to VT may have reduced in comparison to the first to seventh voltages V1 to V7 explained with reference to FIGS. 6 to 8.

A fourth voltage V4' may be used when first page data PD1, i.e., first bits B1 are read from the memory cells MC. A first bit B1 of memory cells having a threshold voltage lower than the fourth voltage V4' may be decided to be '1'.

A first bit B1 of memory cells MC having a threshold voltage higher than the fourth voltage V4' may be decided to be '0'.

A second voltage V2' and a sixth voltage V6' may be used when second page data PD2, i.e., second bits B2 are read from the memory cells MC. A second bit B2 of memory cells MC having a threshold voltage lower than the second voltage V2' or higher than the sixth voltage V6' may be decided to be '1'. A second bit B2 of memory cells MC having a threshold voltage between the second voltage V2' and the sixth voltage V6' may be decided to be '0'.

A first voltage V1', a third voltage V3', and a fifth voltage V5' may be used when third page data PD3, i.e., third bits B3 are read from the memory cells MC. A third bit B3 of memory cells MC having a threshold voltage lower than the first voltage V1', between the third voltage V3' and the fifth voltage V5', or higher than the seventh voltage V7' may be decided to be '1'. A third bit B3 of memory cells MC having a threshold voltage between the first voltage V1' and the third voltage V3' or between the fifth voltage V5' and the seventh voltage VT may be decided to be '0'.

A third error correction is performed, for example by the error correction encoder and decoder 127, on each second error field having errors outside of the second range of third and fifth data D3 and D5 to generate sixth data D6 (S430). For example, error correction may be performed on the sixth data D6 using the third data D3 to correct errors within a third range. The third data D3 may be read from the second region (host buffer region) 125 of the internal memory 123.

For example, each memory cell MC may correspond to a single bit of the third data D3 and a single bit of the fifth data D5. The error correction encoder and decoder 127 may map likelihood values of each second error field of the third data D3 and the fifth data D5 to generate mapping data. The third error correction may be performed using the mapping data to which likelihood values are mapped and a parity check matrix.

If the third error correction decoding is performed, sixth data D6 is generated. Among fields F2 and F4 of the sixth data D6, error-corrected fields F2 and F4 may be written into a corresponding field stored in the second region (host buffer region) 125 of the internal memory 123.

Determination is made, for example by the error correction encoder and decoder 127, as to whether there is an error (S440). In at least some example embodiments of the inventive concepts, after the third error correction is performed, the error correction encoder and decoder 127 may determine whether there is an error-uncorrected field among the fields F2 to F4 of the sixth data D6 as it has an error outside of the third range.

When there is no error, the buffer data BD stored in the second region (host buffer region) is output (S450). For example, the buffer data BD may be output to an external host as error-corrected final read data. As another example, the buffer data may be rewritten into the nonvolatile memory 110 or may be internally used in the memory controller 120.

When there is an error, the next process is performed (S460) for example by the error correction encoder and decoder 127. For example, a subsequent operation may be performed to normally read data from the memory cells MC.

As described above, the second region (host buffer region) 125 of the internal memory 123 of the memory controller 120 may be allocated to store data read from the nonvolatile memory 110. While reading the data from the nonvolatile memory 110, some of data stored in the second region (host buffer region) 125 may be invalid data. For example, in the second section of data reading explained with reference to FIGS. 9 to 11, the second and fourth fields F2 and F4 of the buffer data BD are error-containing fields and invalid data that are not used during the data reading. Thus, similar to the third section of data reading explained with reference to FIGS. 12 to 14, the second and fourth fields F2 and F4 of the buffer data BD may be used to store information used during the data reading, i.e., some of the third data D3.

Accordingly, since a storage space to store backup data is secured in the second region (host buffer region) 125 when capacity of the first region (processing region) 124 of the internal memory 123 is not sufficient, operating performance of the memory system 100 may be improved. In addition, since the storage space to store the backup data is not required in the first region (processing region) 124, capacity of the first region 124 may be reduced and manufacturing cost of the memory system 100 may be reduced. In particular, if at least some example embodiments of the inventive concepts are applied to devices including a limited internal memory such as embedded multimedia card (eMMC) and universal flash storage (UFS), operating performances of the devices may be significantly improved.

Figure 15:
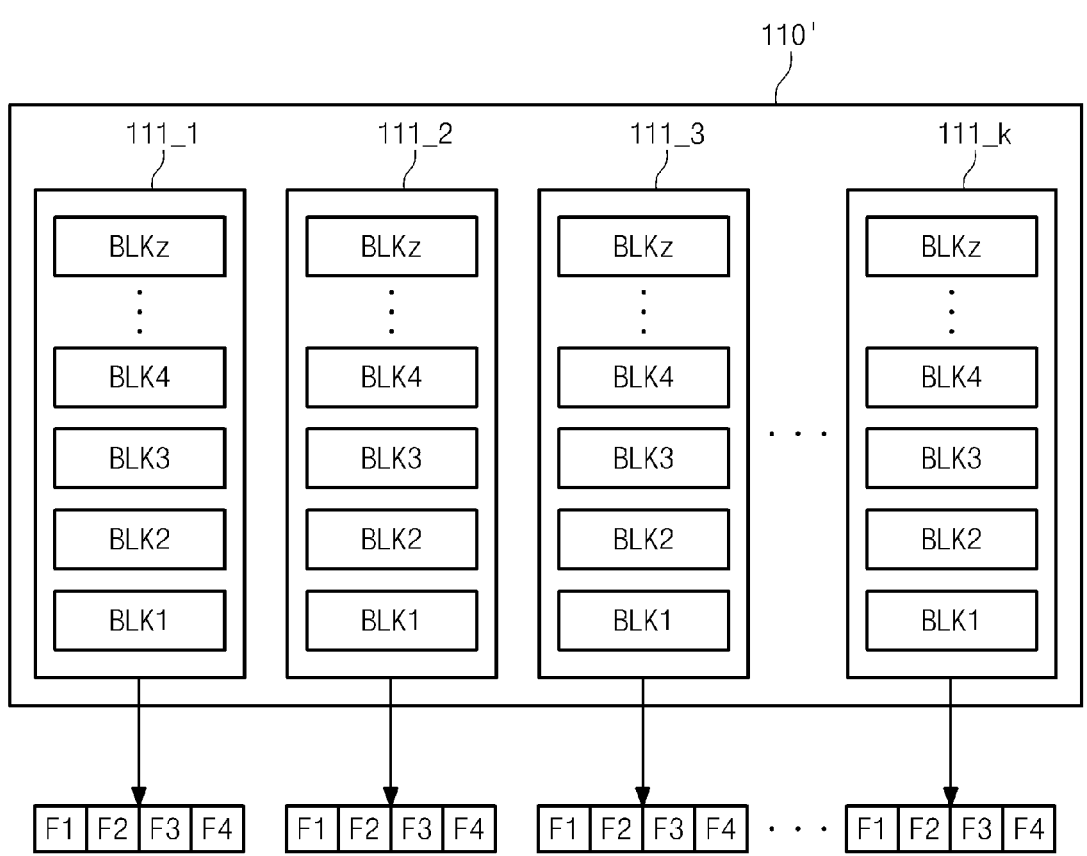
FIG. 15 is a block diagram of a memory cell array according to at least one example embodiment of the inventive concepts.

FIG. 15 is a block diagram of a memory cell array 110' according to at least one example embodiment of the inventive concepts. As illustrated, the memory cell array 110' includes a plurality of planes 111_1 to 111_k. According to at least one example embodiment of the inventive concepts, the planes 111_1 to 111_k may each have the same structure. Each of the planes 111_1 to 111_k includes a plurality of blocks BLK1 to BLKz.

Data may be simultaneously read from the planes 111_1 to 111_k. Data read from each of the planes 111_1 to 111_k includes a plurality of fields F1 to F4. The more the number of planes of the memory cell array 110' increases, the more the amount of data read from the memory cell array 110' at one time increases, i.e., the amount of third data D3 increases. According to at least some example embodiments of the inventive concepts, if a second region (host buffer region) 125 of the internal memory 123 is set to store the third data, an additional memory to store high-capacity third data D3 is not required. Thus, manufacturing cost of the memory system 100 may be reduced. In particular, if at least some example embodiments of the inventive concepts are applied to devices including a limited internal memory such as embedded multimedia card (eMMC) and universal flash storage (UFS), operating performances of the devices may be significantly improved.

Figure 16:
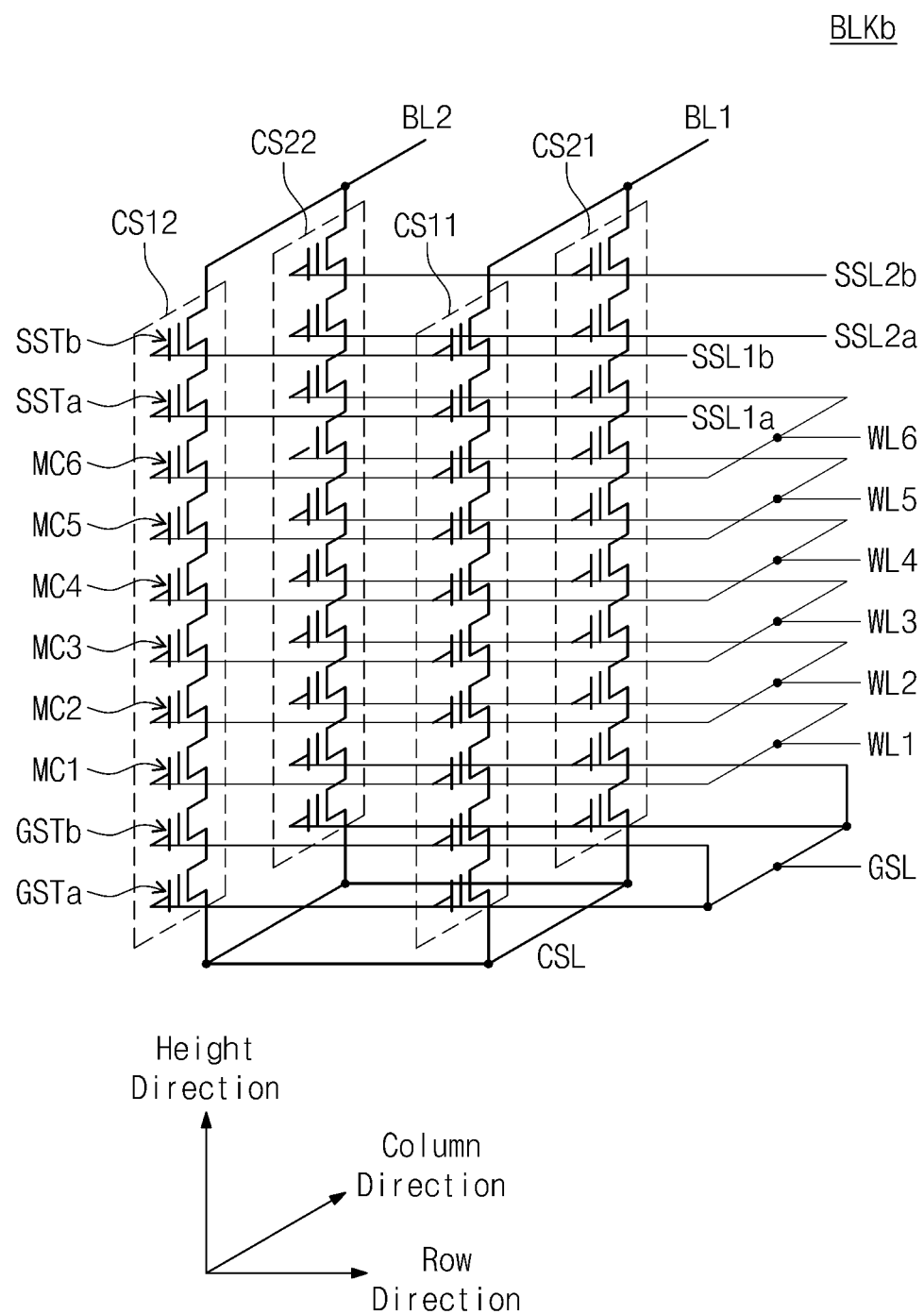
FIG. 16 is a circuit diagram of a memory block according to at least one example embodiment of the inventive concepts.

FIG. 16 is a circuit diagram of a memory block BLKb according to at least one example embodiment of the inventive concepts. As illustrated, the memory block BLKb includes a plurality of cell strings CS11 to CS21 and CS12 to CS22. The cell strings CS11 to CS21 and CS12 to CS22 may be arranged in a row direction and a column direction to form rows and columns.

For example, cell strings CS11 and CS12 arranged in the row direction may form a first row and cell strings CS21 and CS22 arranged in the row direction may form a second row. Cell strings CS11 and CS21 arranged in the column direction may form a first column and cell strings CS12 and CS22 arranged in the column direction may form a second column.

Each of the cell strings CS11 to CS21 and CS12 to CS22 may include a plurality of cell transistors. The cell transistors include ground selection transistors GSTa and GSTb, memory cells MC1 to MC6, and string selection transistors SSTa and SSTb. Ground selection transistors GSTa and GSTb, memory cells MC1 to MC6, and string selection transistors SSTa and SSTb of each cell string may be stacked in a height direction perpendicular to a plane on which the cell strings CS11 to CS21 and CS12 to CS22 are arranged along rows and columns (e.g., a plane on a substrate of the memory block BLKb).

A lowermost ground selection transistor GSTa may be commonly connected to a common source line CSL.

The ground selection transistors GSTa and GSTb of the cell strings CS11 to CS21 and CS12 to CS22 may be commonly connected to a ground selection line GSL.

In at least some example embodiments of the inventive concepts, ground selection transistors of the same height (or order) may be connected to the same ground selection line, and ground selection transistors of different heights (or orders) may be connected to different ground selection lines. For example, ground selection transistors of first height may be commonly connected to a first ground selection line, and ground selection transistors of second height may be commonly connected to a second ground selection line.

In at least some example embodiments of the inventive concepts, ground selection transistors of the same row may be connected to the same ground selection line, and ground selection transistors of different rows may be connected to different ground selection lines. For example, ground selection transistors GSTa and GSTb of cell strings CS11 and CS12 of a first row may be connected to a first ground selection line, and ground selection transistors GSTa and GSTb of cell strings CS21 and CS22 of a second row may be connected to a second ground selection line.

Memory cells disposed at the same height (or order) from a substrate (or ground selection transistors GST) may be commonly connected to a single wordline, and memory cells disposed at different heights (or orders) from the substrate (or the ground selection transistors GST) may be connected to different wordlines WL1 to WL6, respectively. For example, memory cells MC1 are commonly connected to the wordline WL1. Memory cells MC2 are commonly connected to the wordline WL2. Memory cells MC3 are commonly connected to the wordline WL3. Memory cells MC4 are commonly connected to the wordline WL4. Memory cells MC5 are commonly connected to the wordline WL5. Memory cells MC6 are commonly connected to the wordline WL6.

In first string selection transistors SSTa of the same height (or order) of the cell strings CS11 to CS21 and CS12 to CS22, first string selection transistors SSTa of different rows are connected to different string selection lines SSL1a to SSL2a, respectively. For example, first string selection transistors SSTa of the cell strings CS11 and CS12 are commonly connected to the string selection line SSL1a. First string selection transistors SSTa of the cell strings CS21 and CS22 are commonly connected to the string selection line SSL2a.

In second string selection transistors SSTb of the same height (or order) of the cell strings CS11 to CS21 and CS12 to CS22, second string selection transistors SSTb of different rows are connected to different string selection lines SSL1b to SSL2b, respectively. For example, second string selection transistors SSTb of the cell strings CS11 and CS12 are commonly connected to the string selection line SSL1b. Second string selection transistors SSTb of the cell strings CS21 and CS22 are commonly connected to the string selection line SSL2b.

That is, cell strings of different rows are connected to different string selection lines. String selection transistors of the same height (or order) of cell strings of the same row are connected to the same string selection line. String selection transistors of different heights (or orders) of cell strings of the same row are connected to different string selection lines.

In at least some example embodiments of the inventive concepts, string selection transistors of cell strings of the same row may be commonly connected to a single string selection line. For example, string selection transistors SSTa and SSTb of the cell strings CS11 and CS12 of a first row may be commonly connected to a single string selection line. String selection transistors SSTa and SSTb of the cell strings CST21 and CS22 of a second row may be commonly connected to a single string selection line.

Columns of the cell strings CS11 to CS21 and CS12 to CS22 are connected to different bitlines BL1 and BL2, respectively. For example, string selection transistors SSTb of the cell strings CS11 to CS21 of a first column are commonly connected to a bitline BL1. String selection transistors SST of the cell strings CS12 to CS22 of a second column are commonly connected to a bitline BL2.

The memory block BLKb shown in FIG. 16 is an example. Example embodiments of the inventive concepts are not limited to the memory block BLKb shown in FIG. 16.

For example, according to at least some example embodiments of the inventive concepts, the number of rows of cell strings may increase or decrease. Further, as the number of the rows of the cell strings varies, the number of string selection lines or ground selection lines connected to the rows of the cell strings and the number of cell strings connected to a single bitline may also vary.

The number of columns of cell strings may increase or decrease. As the number of the columns of the cell strings varies, the number of bitlines connected to the columns of the cell strings and the number of cell strings connected to a single string selection line may also vary.

Height of cells strings may increase or decrease. For example, the number of ground selection transistors, memory cells or string selection transistors respectively connected to the cell strings may increase or decrease.

In at least some example embodiments of the inventive concepts, a read operation and a write operation may be performed in units of rows of the cell strings CS11 to CS21 and CS12 to CS22. The cell strings CS11 to CS21 and CS12 to CS22 may be selected in unit of a single row by the string selection lines SSL1a, SSL1b, SSL2a, and SSL2b.

A write operation and a read operation may be performed in units of wordlines at the selected row of the cell strings CS11 to CS21 and CS12 to CS22. Memory cells connected to a selected wordline may be programmed at the selected row of the cell strings CS11 to CS21 and CS12 to CS22.

Figure 17:
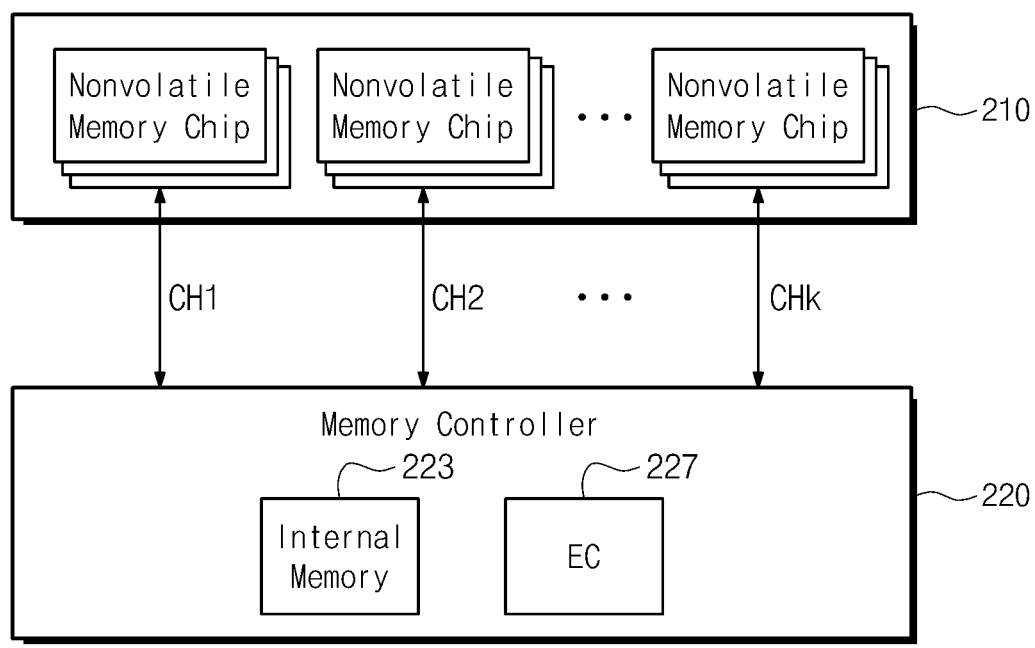
FIG. 17 is a block diagram of a memory system according to at least one example embodiment of the inventive concepts.

FIG. 17 is a block diagram of a memory system 200 according to at least one example embodiment of the inventive concepts. As illustrated, the memory system 200 includes a nonvolatile memory 210 and a memory controller 220. The nonvolatile memory 210 includes a plurality of memory chips. The nonvolatile memory chips are divided into a plurality of groups. Each group of the nonvolatile memory chips is configured to communicate with the controller 220 through a single common channel. As an example, it is shown that the nonvolatile memory chips communicate with the controller 220 through first to kth channels CH1 to CHk.

In FIG. 17, a plurality of nonvolatile memory chips are illustrated as being connected to a single channel. However, the memory system 200 may be modified such that a single nonvolatile memory chip is connected to a single channel. For example, according to at least one example embodiment of the inventive concepts, a plurality of nonvolatile memory chips may have one-to-one relationships, respectively, with a plurality of channels.

The memory controller 220 may include an internal memory 223 and an error correction encoder and decoder 227, which may have the same structure and operation as that described above with respect to the internal memory 123 and an error correction encoder and decoder 127. The memory controller 220 may back up third data D3 read from the nonvolatile memory 210 to a host buffer region of the internal memory 223. For example, the memory controller 220 may operate in the same manner discussed above with respect to the memory controller 120 and FIGS. 1-15.

Figure 18:
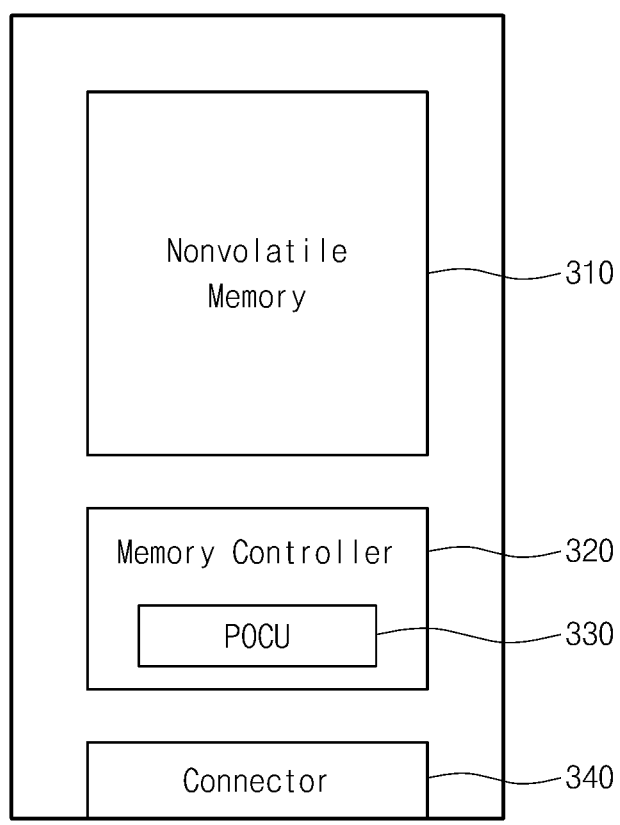
FIG. 18 is a block diagram of a storage module according to at least one example embodiment of the inventive concepts.

FIG. 18 is a block diagram of a storage module 300 according to at least one example embodiment of the inventive concepts. As illustrated, the storage module 300 includes a nonvolatile memory 310, a memory controller 320, and a connector 340.

The memory controller 320 may include a program operation control unit (POCU) 330. That is, the memory controller 320 may identify a normal mode or a dump mode while a program operation is performed in the nonvolatile memory 310. The memory controller 320 may load page data associated with a subsequent program operation to the nonvolatile memory 310 according to the identified mode. In the normal mode, the memory controller 320 may load single page data associated with the subsequent program operation to the nonvolatile memory 310. In the dump mode, the memory controller 320 may transmit two or more page data associated with the subsequent program operation to the nonvolatile memory 310. In the dump mode, the memory controller 320 may transmit at least one dump command associated with the subsequent program operation to the nonvolatile memory 210.

The connector 340 may connect the storage module 400 to an external device. The connector 340 may include a socket based on standards including, for example, one or more of SATA (Serial AT Attachment), eSATA, PCI (Peripheral Component Interconnect), PCI-e, SCSI (Small Computer System Interface), USB (Universal Serial Bus), Mini USB, Micro USB, and Firewire. The connector 340 may include connecting means such as a pin grid array (PGA) and a ball grid array (BGA).

The storage module 300 may constitute various storage modules including, for example, one or more of a solid-state drive (SSD), a person computer memory card international association (PCMCIA) card, a compact flash card (CF), smart media cards (SM and SMC), a memory stick, multimedia cards (MMC, RS-MMC, and MMCmicro), SD cards (SD, miniSD, microSD, and SDHC), a universal flash storage (UFS) module, and an embedded MMC (eMMC) module.

According to at least one example embodiment of the inventive concepts, the memory controller 320 may operate in the same manner discussed above with respect to the memory controller 120 and FIGS. 1-15.

Figure 19:
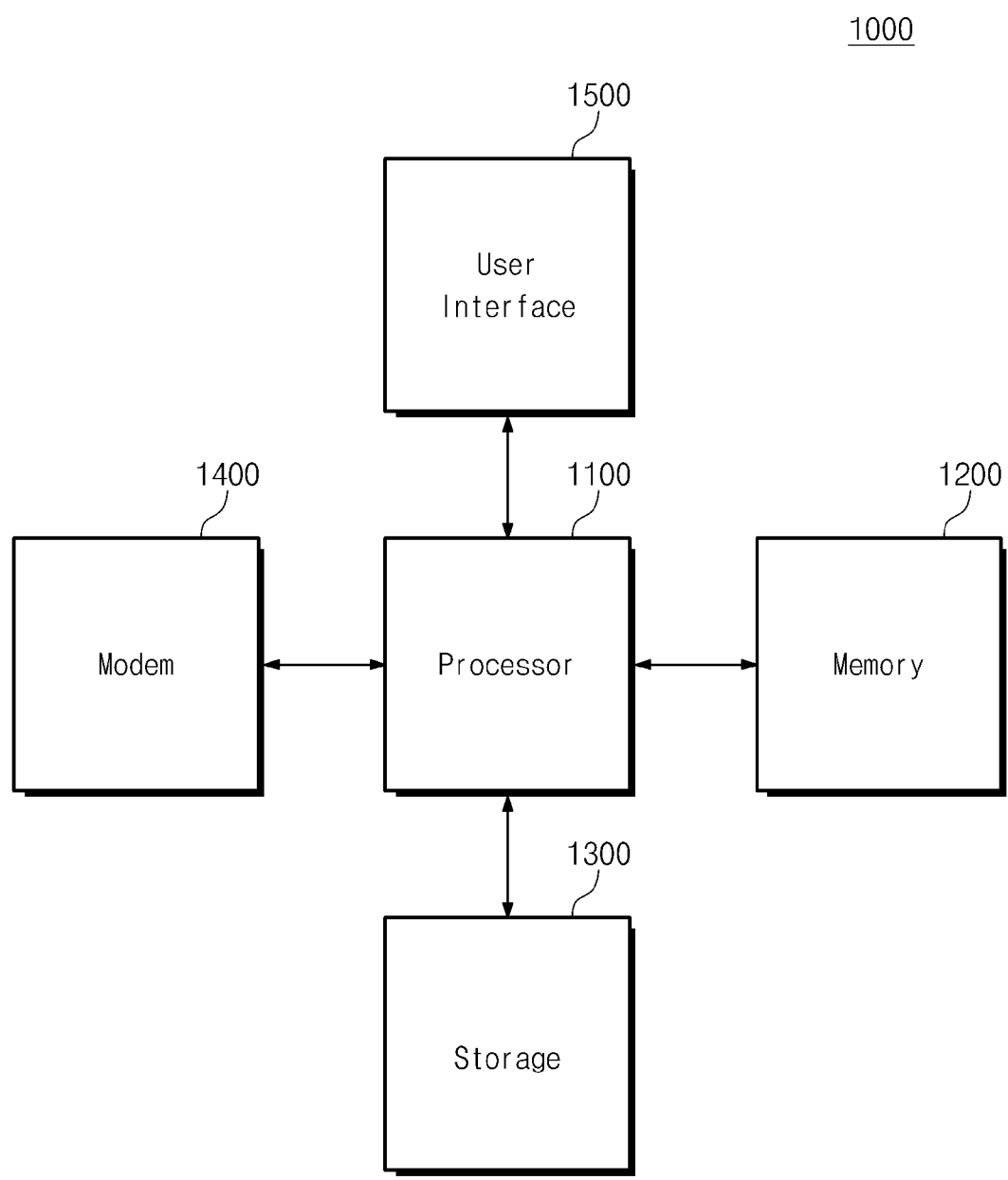
FIG. 19 is a block diagram of a computing device according to at least one example embodiment of the inventive concepts.

FIG. 19 is a block diagram of a computing device 1000 according to at least one example embodiment of the inventive concepts. As illustrated, the computing device 1000 includes a processor 1100, a memory 1200, a storage 1300, a modem 1400, and a user interface 1500.

The processor 1100 may control the overall operation of the computing device 1000 and perform a logical operation. For example, the processor 1100 may include a system-on-chip (SoC). The processor 1100 may be, for example, a hardware-implemented data processing device having circuitry that is physically structured to execute code and/or instructions included, for example, in a program. Examples of the above-referenced hardware-implemented data processing device include, but are not limited to, a microprocessor, a central processing unit (CPU), a processor core, a multiprocessor, an application-specific integrated circuit (ASIC), and a field programmable gate array (FPGA) a general-purpose processor for use in a general-purpose computer, a specific-purpose processor for use in a specific-purpose computer or an application processor for use in a mobile computing device.

The memory 1200 may communicate with the processor 1100. The memory 1200 may be a main memory of the processor 1100 or the computing device 1000. The processor 1100 may temporarily store a code or data in the memory 1200. The processor 1100 may execute the code and process the data using the memory 1200. The processor 1100 may execute various types of software such as an operating system (OS) and an application using the memory 1200. The processor 1100 may control the overall operation of the computing device 1000 using the memory 1200. The memory 1200 may include a volatile memory including, for example, one or more of a static RAM (SRAM), a dynamic RAM (DRAM), and a synchronous DRAM (SDRAM) or a nonvolatile memory such as a flash memory, a phase-change RAM (PRAM), a magnetoresistive RAM (MRAM), a resistive RAM (RRAM), and a ferroelectric RAM (FRAM). The memory 120 may include a random access memory.

The storage 130 may communicate with the processor 1100. The storage 1300 may store data required to be preserved in the long term. That is, the processor 1100 may store data required to be preserved in the long term in the storage 1300. The storage 1300 may store a boot image to drive the computing device 1000. The storage 1300 may store source codes of various types of software such as an operating system (OS) and an application. The storage 1300 may store data processed by various types of software such as an operating system (OS) and an application.

In at least some example embodiments of the inventive concepts, the processor 1100 may load source codes stored in the storage 1300 to the memory 1200 and execute the source codes loaded to the memory 1200 to drive various types of software such as an operating system (OS) and an application. The processor 1100 may load data stored in the storage 1300 to the memory 1200 and process the data loaded to the memory 1200. The processor 1100 may store data required to be preserved in the long term, among data stored in the memory 1200, in the storage 1300.

The storage 1300 may include, for example, one or more of a nonvolatile memory such as a flash memory, a phase-change RAM (PRAM), a magnetic RAM (MRAM), a resistive RAM (RRAM), and a ferroelectric RAM (FRAM).

The storage 1300 may include the storage module 300 explained with reference to FIG. 18. When the storage module 300 explained with reference to FIG. 18 is adopted in the computing device 1000, speed of reading data from the storage 1300 by the processor 1100 is significantly improved. Thus, operating performance of the computing device 1000 may enhanced.

The modem 1400 may communicate with an external device according to the control of the processor 1100. For example, the modem 1400 may perform wired or wireless communication with the external device. The modem 1400 may perform communication based on at least one of various wireless communication schemes such as long term evolution (LTE), WiMax, global system for mobile communication (GSM), (code division multiple access (CDMA), Bluetooth, (near field communication (NFC), WiFi, and radio frequency identification (RFID) or at least one of various wired communication schemes such as universal serial bus (USB), serial AT attachment (SATA), small computer system interface (SCSI), Firewire, and peripheral component interconnection (PCI).

The user interface 1500 may communicate with a user according to the control of the processor 1100. For example, the user interface 1500 may include user input interfaces such as a keyboard, a keypad, a button, a touch panel, a touch screen, a touch pad, a touch ball, a camera, a microphone, a gyroscope sensor, and a vibration sensor. The user interface 150 may include user output interfaces such as a liquid crystal display (LCD), an organic light emitting diode (OLED) display, an active matrix OLED (AMOLED), an LED, a speaker, and a monitor.

The computing device 1000 may constitute a mobile computing device such as a smart phone, a smart pad, and a smart camera. The computing device 1000 may constitute various devices such as a personal computer (PC), a laptop computer, and a smart television.

According to at least some example embodiments of the inventive concepts, backup data used during error correction is stored in an internal memory storing error data unused during the error correction. Since a space to store the backup data is additionally secured in the internal memory having limited capacity, high-capacity backup data may be simultaneously backed up in the internal memory. Thus, there are provided a memory controller with improved operating performance and a method of reading data from a nonvolatile memory by the memory controller.

Example embodiments having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims. For example, it is possible to adjust the driving capability of a sub word line driver or adjust the slope of level of applied driving signals by changing, adding, or removing the circuit configuration or arrangement in the drawings without departing from the technical spirit of example embodiments of the inventive concepts in other cases.

What is claimed is:

1. A data reading method of reading data from a nonvolatile memory by a memory controller including an internal memory, the data reading method comprising:
    reading first data from memory cells of the nonvolatile memory;
    storing the read first data in the internal memory;
    overwriting some of the read first data stored in the internal memory with backup data;
    performing a first error correction operation using the backup data stored in the internal memory; and
    overwriting the backup data stored in the internal memory with data corrected by the first error correction operation.

2. The data reading method as set forth in clam 1, further comprising:
    after overwriting the backup data with the corrected data, outputting the data stored in the internal memory to an external entity as data read from the nonvolatile memory.

3. The data reading method as set forth in claim 1, wherein the reading first data from memory cells includes reading the first data such that a size of the read first data is a size of a read unit of data read at one time by the nonvolatile memory.

4. The data reading method as set forth in claim 1, further comprising:
    overwriting the backup data with data containing an error.

5. The data reading method as set forth in claim 1, further comprising:
    reading second data from the memory cells using a soft decision,
    wherein the backup data is associated with the soft decision.

6. The data reading method as set forth in claim 1, further comprising:
    reading second data from the memory cells,
    wherein the first error correction operation is performed based on the backup data and the second data.

7. The data reading method as set forth in claim 6, wherein the reading the second data includes reading the second data using read voltages that are different from read voltages used when the first data was read.

8. The data reading method as set forth in claim 1, wherein the first data read from the memory cells includes a plurality of fields, and
    wherein the storing the read first data in the internal memory comprises:
    performing an error correction operation on each field of the read first data to generate second data; and
    storing the second data in the internal memory.

9. The data reading method as set forth in claim 8, wherein the overwriting some of the read first data with the backup data comprises:
    reading third data from the memory cells using a soft decision;
    performing a second error correction operation on an error-containing one of the fields of the second data using the third data to generate fourth data; and
    overwriting a corresponding one of fields of the third data into an error field among the fields of the second data stored in the internal memory as the backup data,
    wherein the error field is a field containing an error that is not corrected by the second error correction.

10. The data reading method as set forth in claim 9, wherein the performing a first error correction operation using the backup data comprises:
    reading fourth data from the memory cells; and
    performing a third error correction operation on a field of the fourth data corresponding to the error field using the backup data.

11. The data reading method as set forth in claim 10, wherein the overwriting the backup data with the data corrected by the error correction operation comprises:
    overwriting the error field stored in the internal memory with an error-corrected field corrected by the first error correction operation.

12. The data reading method as set forth in claim 1, wherein the error correction is performed based on low-density parity check (LDPC) code.

13. A data reading method of reading data from a nonvolatile memory by a memory controller including an internal memory, the data reading method comprising:
    reading first data from memory cells of the nonvolatile memory using a first reading operation;
    storing the read first data in the internal memory;
    reading second data from the memory cells of the nonvolatile memory using a second reading operation;
    generating backup data based on the second reading operation;
    overwriting some of the read first data stored in the internal memory with backup data; and performing a first error correction operation using the backup data stored in the internal memory.

14. The data reading method of claim 13 further comprising:
overwriting the backup data stored in the internal memory with data corrected by the first error correction operation.

15. The data reading method of claim 13, wherein the first reading operation is a hard decision reading operation and the second reading operation is a soft decision reading operation.

16. The data reading method of claim 13, wherein the internal memory includes a processing region and a host buffer region, and
the method further comprises:
allocating the processing region to a processing core to use for executing an algorithm; and
allocating the host buffer region to store data to be output from the memory controller to an external host,
the backup data being overwritten in the host buffer region and not stored in the processing region.

17. A data reading method of reading data from a nonvolatile memory by a memory controller, the data reading method comprising:
performing a first reading operation on memory cells of the nonvolatile memory;
performing a first error correction operation on a result of the first reading operation;
storing a result of the first error correction operation in a memory;
performing a second reading operation on the memory cells of the nonvolatile memory;
performing a second error correction operation on a result of the second reading operation;
overwriting a first portion of the result of the first error correction operation stored in the memory with a first portion of a result of the second error correction operation; and
overwriting a second portion of the result of the first error correction operation stored in the memory with a second portion of the result of the second reading operation.

18. The data reading method of claim 17, wherein the first and second portions of the result of the first error correction operation include errors,
wherein the first portion of the result of the second error correction operation has no error, and
wherein the second portion of the result of the second reading operation include errors which are not corrected by the second error correction operation.

19. The data reading method of claim 18, further comprising:
performing a third reading operation on the memory cells of the nonvolatile memory; and
performing a third error correction operation on a result of the third reading operation using the second portion of the result of the second reading operation stored in the memory.

20. The data reading method of claim 18, wherein the second error correction operation is performed using the result of the first reading operation.

* * * * *